US011259441B2

United States Patent
Mito et al.

(10) Patent No.: US 11,259,441 B2
(45) Date of Patent: Feb. 22, 2022

(54) ELECTRONIC APPARATUS HAVING FOREIGN MATTER PREVENTING ELEMENT

(71) Applicant: Sony Interactive Entertainment Inc., Tokyo (JP)

(72) Inventors: Satoshi Mito, Chiba (JP); Yasuhiro Ootori, Kanagawa (JP); Keiichi Aoki, Kanagawa (JP)

(73) Assignee: Sony Interactive Entertainment Inc., Tokyo (JP)

(*) Notice: Subject to any disclaimer, the term of this patent is extended or adjusted under 35 U.S.C. 154(b) by 0 days.

(21) Appl. No.: 16/981,169

(22) PCT Filed: Mar. 20, 2019

(86) PCT No.: PCT/JP2019/011712
§ 371 (c)(1),
(2) Date: Sep. 15, 2020

(87) PCT Pub. No.: WO2019/182014
PCT Pub. Date: Sep. 26, 2019

(65) Prior Publication Data
US 2021/0120700 A1    Apr. 22, 2021

(30) Foreign Application Priority Data
Mar. 20, 2018    (JP) .............................. JP2018-053567

(51) Int. Cl.
*H05K 7/20* (2006.01)
*H05K 5/02* (2006.01)
*G06F 1/20* (2006.01)

(52) U.S. Cl.
CPC ....... *H05K 7/20181* (2013.01); *H05K 5/0213* (2013.01); *H05K 7/20145* (2013.01); *H05K 7/20154* (2013.01); *G06F 1/20* (2013.01)

(58) Field of Classification Search
CPC ...... G06F 1/20; H05K 7/20136–20163; H05K 7/20181
See application file for complete search history.

(56) References Cited

U.S. PATENT DOCUMENTS 7,714,731 B2 * 5/2010 Palaszewski .......... H05K 7/207
340/584
9,847,104 B2  12/2017 Hirose
(Continued)

FOREIGN PATENT DOCUMENTS

JP       51-59236       5/1976
JP    2005347450 A    12/2005
(Continued)

OTHER PUBLICATIONS

International Preliminary Report on Patentability and Written Opinion for corresponding PCT Application No. PCT/JP2019/011712, 16 pages, dated Oct. 1, 2020.
(Continued)

*Primary Examiner* — Zachary Pape
(74) *Attorney, Agent, or Firm* — Matthew B. Dernier, Esq.

(57) ABSTRACT

Foreign matter is prevented from entering the inside of an electronic apparatus. An electronic apparatus (100) includes plural exhaust holes (E1, E2) formed in an armor member (20), an air flow path (S3) formed inside the armor member (20) and connected to the plural exhaust holes (E1, E2), a power source circuit (41) disposed in the air flow path (S3), and a foreign matter preventing member (70) located between the power source circuit (41) and the plural exhaust holes (E1, E2). The foreign matter preventing member (70) is formed with plural openings (Es). Each of the openings (Es) is smaller in size than each of the exhaust holes (E1, E2).

16 Claims, 19 Drawing Sheets

(56) References Cited

U.S. PATENT DOCUMENTS

| | | | |
|---|---|---|---|
| 9,974,207 B2 | 5/2018 | Tsuchida | |
| 10,629,869 B2 | 4/2020 | Nakamura | |
| 2011/0120067 A1* | 5/2011 | Kim | B01D 46/0027 55/385.1 |
| 2011/0253413 A1* | 10/2011 | Lu | H05K 5/0213 174/50.51 |
| 2014/0362529 A1* | 12/2014 | Tsuchida | H05K 7/20181 361/690 |
| 2015/0116935 A1 | 4/2015 | Zhuang | |
| 2017/0287527 A1 | 10/2017 | Hirose | |
| 2018/0241017 A1 | 8/2018 | Nakamura | |
| 2019/0132969 A1 | 5/2019 | Hirose | |

FOREIGN PATENT DOCUMENTS

| | | | |
|---|---|---|---|
| JP | 2008233177 A | 10/2008 | |
| JP | 2014239167 A | 12/2014 | |
| JP | 2015082593 A | 4/2015 | |
| JP | 2017183670 A | 10/2017 | |
| WO | 2017073201 A1 | 5/2017 | |
| WO | 2017169169 A1 | 10/2017 | |

OTHER PUBLICATIONS

International Search Report for corresponding PCT Application No. PCT/JP2019/011712, 4 pages, dated Jun. 4, 2019.

* cited by examiner

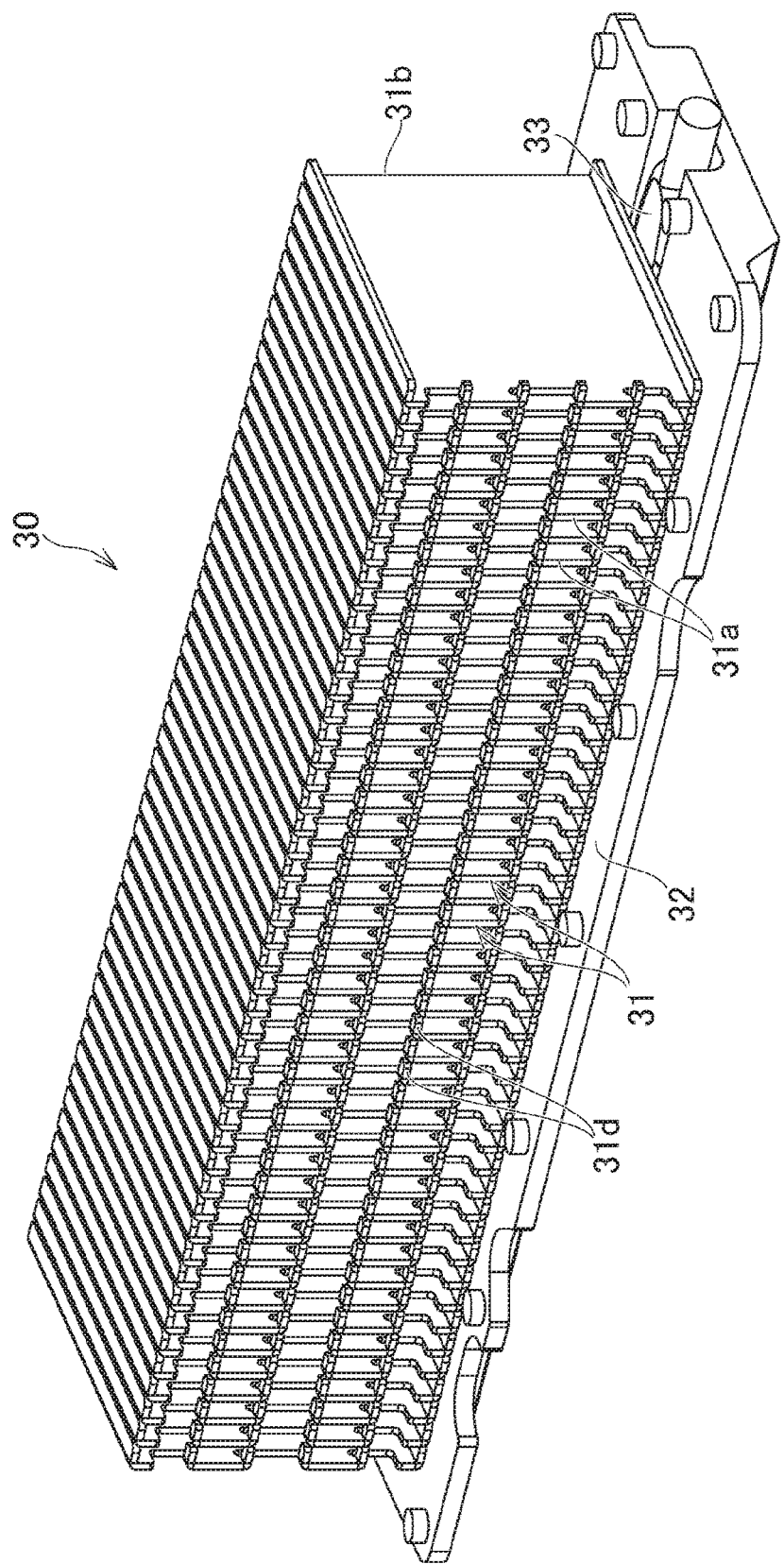

ELECTRONIC APPARATUS HAVING FOREIGN MATTER PREVENTING ELEMENT

TECHNICAL FIELD

The present disclosure relates to an electronic apparatus.

BACKGROUND ART

An electronic apparatus that has a heat generating part such as a power source circuit or an integrated circuit and an air flow path for cooling the heat generating part has been used. In an electronic apparatus disclosed in PTL 1, plural intake holes are formed in a side surface of the apparatus, and air is introduced via the intake holes by driving of a cooling fan. In addition, plural exhaust holes are formed in a back surface of the apparatus, the air introduced by driving of the cooling fan passes through an air flow path in which a heat generating part is disposed, and the air is discharged to the exterior via the exhaust holes. In the following, the intake holes and the exhaust holes will collectively be referred to as vent holes.

CITATION LIST

Patent Literature

[PTL 1] JP 2017-183670A

SUMMARY

Technical Problem

The plural vent holes are sometimes partitioned by plural wall sections (including louvers) aligned at regular intervals. Such wall sections prevent the inside of the electronic apparatus from being exposed via the vent holes. However, foreign matter may enter into the inside of the electronic apparatus via the vent holes. A reduction in the distance between the wall sections (the width of the vent holes) causes lowering in ventilation efficiency, and, therefore, it is difficult to prevent penetration of foreign matter by a method of decreasing the distance between the wall sections.

Solution to Problem

An electronic apparatus proposed in the present disclosure includes an armor member, plural vent holes formed in the armor member, an air flow path formed inside the armor member and connected to the plural vent holes, a heat generating part disposed in the air flow path, and a foreign matter preventing member located in the air flow path between the heat generating part and the plural vent holes. The foreign matter preventing member is formed with plural openings. The size of each of the plural openings is smaller than the size of each of the plural vent holes. According to this electronic apparatus, foreign matter can be restrained from entering the inside of the electronic apparatus. In the electronic apparatus, the foreign matter preventing member may be formed integrally with a part of the armor member or may be formed separately from the armor member. In addition, the foreign matter preventing member may be in contact with the armor member or may be spaced from the armor member.

BRIEF DESCRIPTION OF DRAWINGS

FIG. 10A is a perspective view depicting an example of a heat sink capable of functioning as a second foreign matter preventing member.

DESCRIPTION OF EMBODIMENT

An example of embodiment of an electronic apparatus proposed in the present disclosure will be described below. In the following description, Y1 and Y2 directions indicated in FIG. 1 or the like will respectively be referred to as a forward direction and a rearward direction, X1 and X2 directions will respectively be referred to as a rightward direction and a leftward direction, and Z1 and Z2 directions will be referred to as an upward direction and a downward direction.

An electronic apparatus 100 is an entertainment device functioning as, for example, a game device or an audio-visual apparatus. The electronic apparatus 100 outputs moving image data generated by execution of a game program, video-audio data acquired from a recording medium such as an optical disk, and/or video-audio data acquired through a network to a display device such as a television. The electronic apparatus proposed in the present disclosure is not limited to the entertainment device such as a game device and may be a personal computer.

Figure 2:
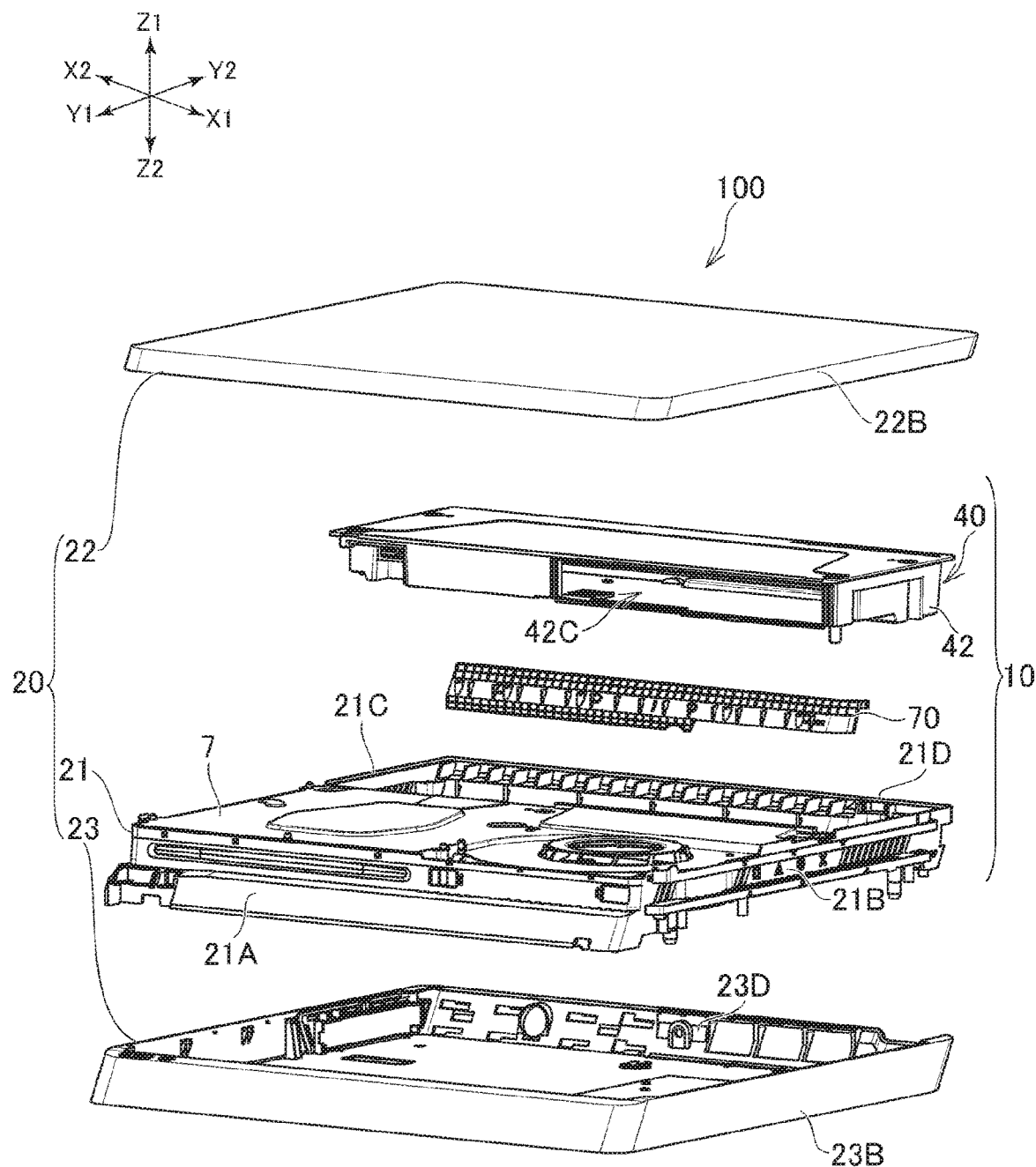
FIG. 2 is an exploded perspective view of the electronic apparatus.

As illustrated in FIG. 2, the electronic apparatus 100 has an apparatus main body 10. The apparatus main body 10 has such parts as a circuit board (not illustrated), a cooling fan 5 (see FIG. 3), an optical disk drive 7 (see FIG. 3), and a power source unit 40. In the example of the electronic apparatus 100, the cooling fan 5 and the optical disk drive 7 are disposed at a front portion of the apparatus main body 10 and are aligned in the left-right direction. The power source unit 40 is disposed on the rear side of the cooling fan 5 and the optical disk drive 7 and is located at a rear portion of the apparatus main body 10. The circuit board is disposed, for example, on the lower side of the cooling fan 5 and the optical disk drive 7. The layout of the parts in the apparatus main body 10 is not limited to that in the example of the electronic apparatus 100 and may be modified as required.

As depicted in FIG. 2, the electronic apparatus 100 has an upper armor cover 22, a lower armor cover 23, and an armor frame 21 as the armor member 20. The armor frame 21 is substantially tetragonal in shape in plan view. The inside of the armor frame 21 is opened in the vertical direction, and the abovementioned parts constituting the apparatus main body 10 are supported on the inside of the armor frame 21. In other words, the armor frame 21 has a front wall section 21A, a right wall section 21B, a left wall section 21C, and a rear wall section 21D (see FIG. 2). The parts constituting the apparatus main body 10 are disposed on the inside of the wall sections 21A to 21D and are attached to the armor frame 21. The upper armor cover 22 covers the upper side of the apparatus main body 10 and is attached to the armor frame 21. The lower armor cover 23 covers the lower side of the apparatus main body 10 and is attached to the armor frame 21.

Note that the configuration of the armor member 20 is not limited to that in the example of the electronic apparatus 100. For example, the electronic apparatus 100 may have a lower housing and an upper housing combined with each other in the vertical direction as the armor member 20. Besides, the parts constituting the apparatus main body 10 may be attached to one of the housings.

Figure 5A:
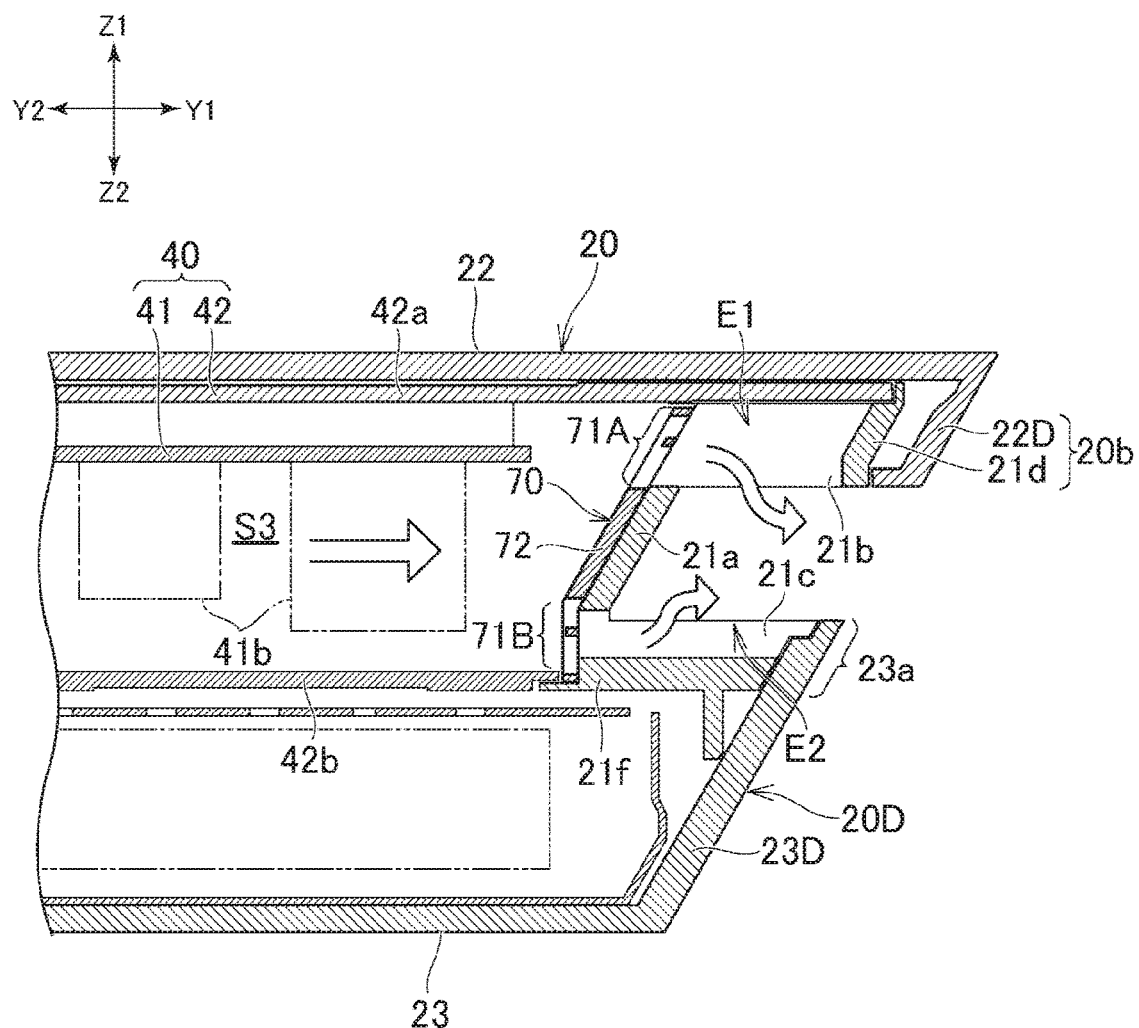
FIG. 5A is a sectional view taken along line V-V of FIG. 4.

The electronic apparatus 100 has an air flow path for cooling a heat generating part possessed by the apparatus main body 10. The heat generating part is, for example, an integrated circuit 4a such as a CPU (Central Processing Unit) or a GPU (Graphics Processing Unit) mounted to a circuit board 4 (see FIG. 2), or a power source circuit possessed by the power source unit 40. As illustrated in FIG. 5A, the armor member 20 has exhaust holes E1 and E2 for discharging air having passed through the air flow path to the exterior. The electronic apparatus 100 has a foreign matter preventing member 70 disposed between the heat generating part and the exhaust holes E1 and E2. In the example of the electronic apparatus 100, the foreign matter preventing member 70 is disposed between the power source circuit 41 and the exhaust holes E1 and E2. More specifically, the foreign matter preventing member 70 is disposed along the exhaust holes E1 and E2. No other part exists between the foreign matter preventing member 70 and the exhaust holes E1 and E2. The foreign matter preventing member 70 is formed in a grid shape in a region facing the exhaust holes E1 and E2 (see FIG. 6) and prevents foreign matter from entering the inside of the electronic apparatus 100 through the exhaust holes E1 and E2.

[Air Flow Path]

The air flow path formed in the apparatus main body 10 will be described.

Figure 3:
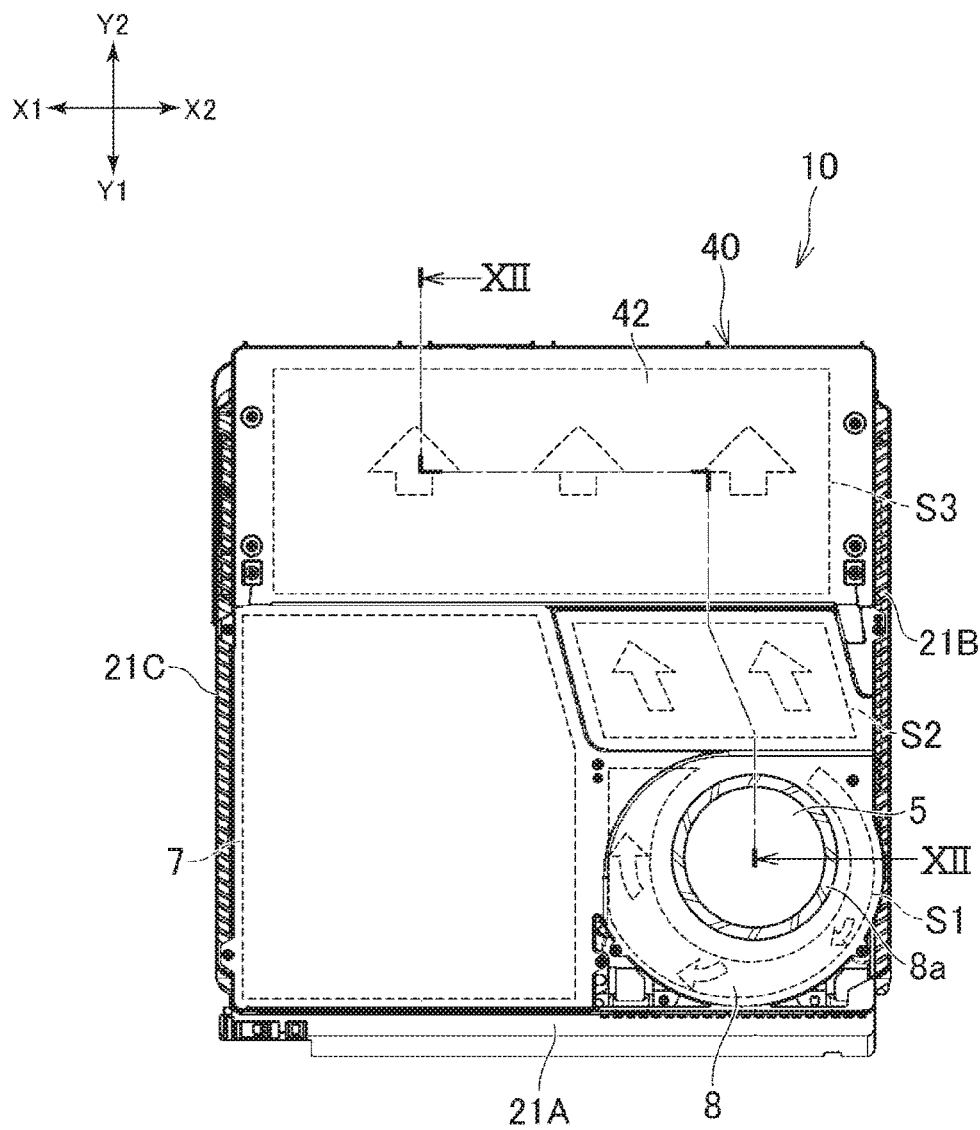
FIG. 3 is a plan view of an apparatus main body and an armor member.

As mentioned above, the apparatus main body 10 has the cooling fan 5. As depicted in FIG. 3, the cooling fan 5 is covered with a cover 8. The cover 8 is formed with an opening 8a located on the upper side of the cooling fan 5. When the cooling fan 5 is driven, air introduced from the exterior flows from the upper side of the cooling fan 5 into the cooling fan 5 through the opening 8a. In addition, the air introduced from the exterior may flow into the cooling fan 5 also from the lower side of the cooling fan 5.

Figure 1:
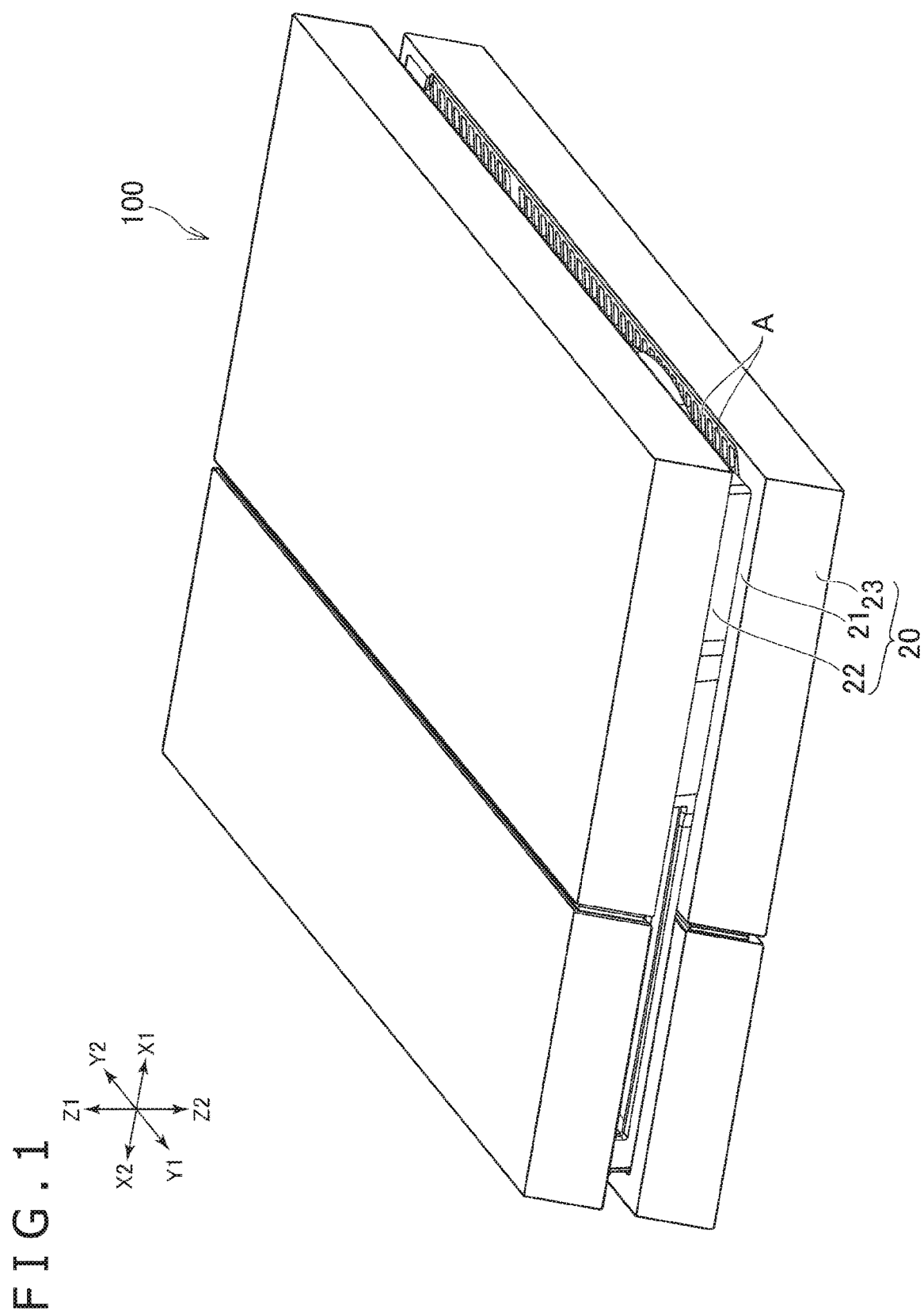
FIG. 1 is a perspective view depicting an example of an electronic apparatus proposed in the present disclosure.

In the example of the electronic apparatus 100, a side surface of the electronic apparatus 100 is formed with intake holes A (see FIG. 1). The intake holes A are formed between a right wall section 21B (see FIG. 2) of the armor frame 21 and a right wall section 23B (see FIG. 2) of the lower armor cover 23. In addition, the intake holes A are also formed between the right wall section 21B (see FIG. 2) of the armor frame 21 and a right wall section 22B (see FIG. 2) of the upper armor cover 22. Besides, a left side surface of the electronic apparatus 100 is also formed with intake holes A. In other words, the intake holes are formed between a left wall section 21C (see FIG. 2) of the armor frame 21 and a left side section of the upper armor cover 22. In addition, the intake holes A are formed also between the left wall section 21C (see FIG. 3) of the armor frame 21 and a left wall section of the lower armor cover 23.

As illustrated in FIG. 3, the apparatus main body 10 has in its inside air flow paths S1, S2, and S3 formed downstream of the cooling fan 5. The air flow paths S1, S2, and S3 are partitioned from the other regions inside the apparatus main body 10 by covers, cases, and wall members. The first air flow path S1 is formed in the periphery of the cooling fan 5. The second air flow path S2 extends rearward from the first air flow path S1 and is located on the rear side of the cooling fan 5. For example, heat sinks in contact with the integrated circuits such as the CPU and the GPU are disposed in the second air flow path S2.

As illustrated in FIG. 3, the third air flow path S3 extends rearward from the second air flow path S2 and is spreading in the left-right direction. In the example of the electronic apparatus 100, the third air flow path S3 is located on the rear side of the heat sinks and the optical disk drive 7 which are disposed in the second air flow path S2. The abovementioned power source unit 40 includes a case 42 (see FIG. 2) and a power source circuit 41 (see FIG. 5A) accommodated in the case 42. Various parts 41b which generate heat are mounted to the power source circuit 41. As depicted in FIG. 2, the case 42 is formed with an opening 42c on the front side. The opening 42c is connected to a wall member (inclusive of a cover) defining the second air flow path S2. The power source circuit 41 is disposed in the third air flow path S3. The case 42 is open on the rear side.

Figure 4:
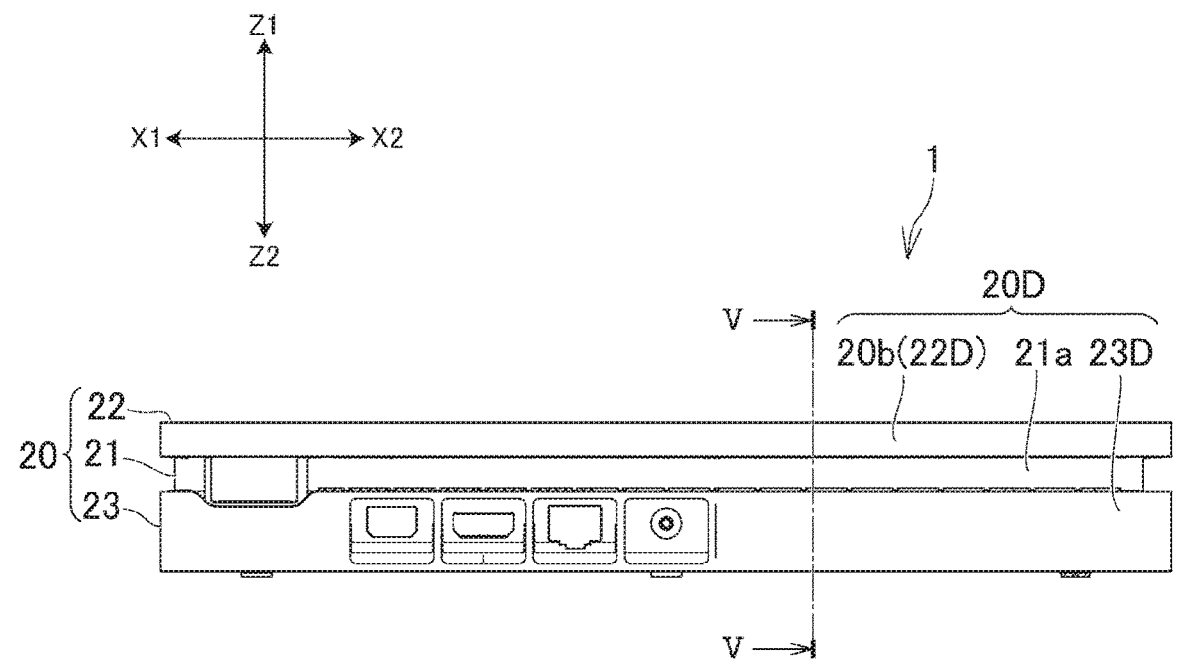
FIG. 4 is a back elevation of the electronic apparatus.
Figure 6:
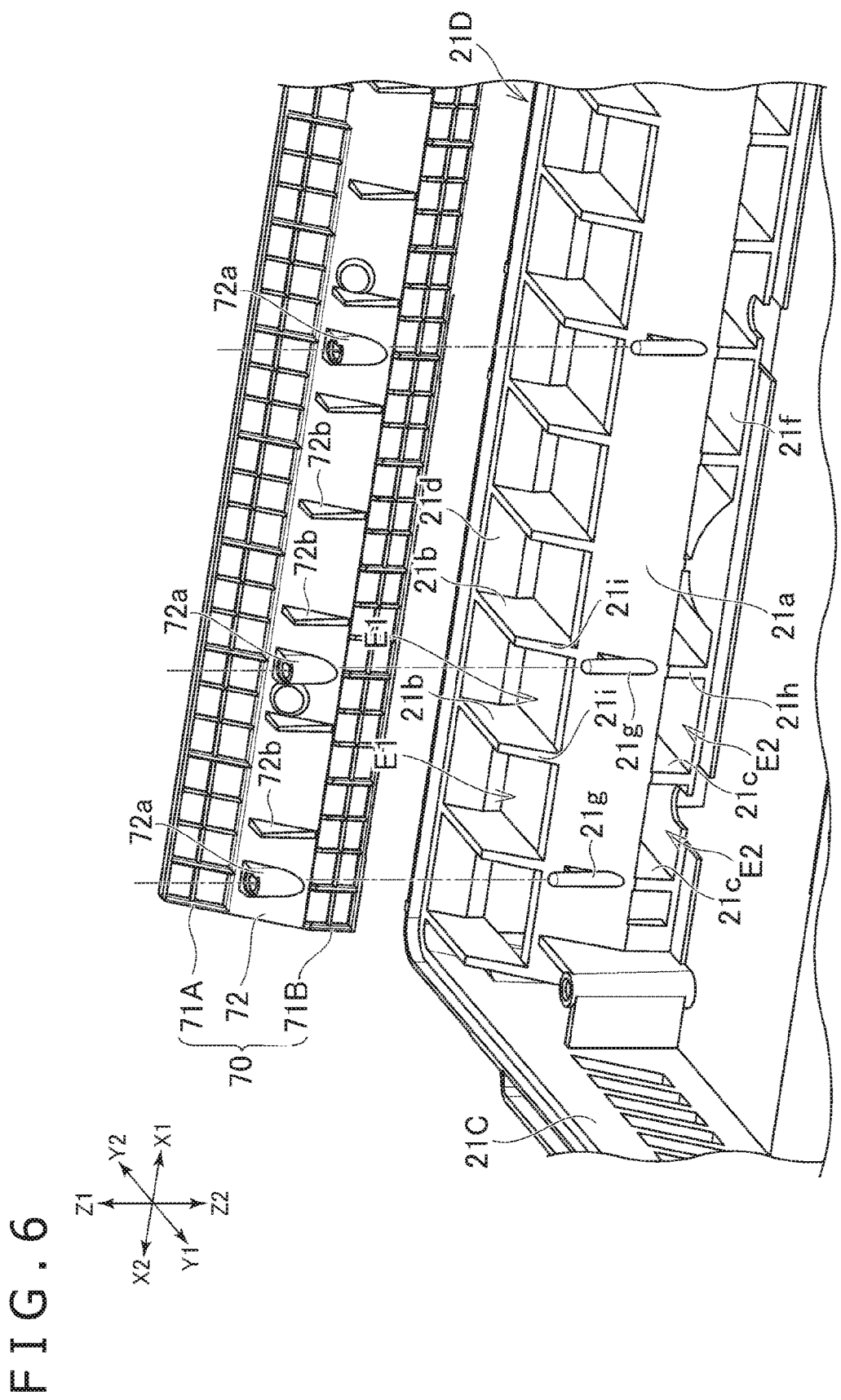
FIG. 6 is a perspective view in which an armor frame and a foreign matter preventing member are depicted in a separated state.

The armor member 20 is formed with the abovementioned plural exhaust holes E1 and E2 (see FIG. 6). In the example of the electronic apparatus 100, the exhaust holes E1 and E2 are formed in a rear wall section 20D (see FIG. 4) of the armor member 20. As illustrated in FIG. 5A, the rear wall section 20D of the armor member 20 includes a first wall section 21a formed along the left-right direction and a second wall section 20b formed along the left-right direction. The second wall section 20b is rearwardly spaced from the first wall section 21a and is upwardly deviated from the first wall section 21a. The plural exhaust holes E1 aligned in the left-right direction are formed between the first wall section 21a and the second wall section 20b. As depicted in FIG. 6, formed between the adjacent two exhaust holes E1 is a partition wall section 21b partitioning them. Plural partition wall sections 21b are aligned at regular intervals in the left-right direction. The partition wall section 21b extends forward from the second wall section 20b and is connected to an upper edge of the first wall section 21a. A lower edge of the second wall section 20b and the upper edge of the first wall section 21a are located at the same height. Therefore, exposure of the inside of the electronic apparatus 100 through the exhaust holes E1 is restrained by the second wall section 20b (see FIG. 4). In the example of the electronic apparatus 100, the first wall section 21a and the second wall section 20b have substantially the same length in the left-right direction, and the exhaust holes E1 are formed over the whole range of the first wall section 21a and the second wall section 20b. Different from this, the second wall section 20b and the first wall section 21a may be different in length. For example, the second wall section 20b may be shorter than the first wall section 21a. In this case, the exhaust holes E1 are formed in the range in which the second wall section 20b is formed.

In addition, as illustrated in FIG. 5A, the rear wall section 20D of the armor member 20 has a third wall section 23a which is formed along the left-right direction. The third wall section 23a is rearwardly spaced from the first wall section 21a and is downwardly deviated from the first wall section 21a. The plural exhaust holes E2 aligned in the left-right direction are formed between the first wall section 21a and the third wall section 23a. Formed between the adjacent two exhaust holes E2 is a partition wall section 21c (see FIG. 6) partitioning them. Plural partition wall sections 21c are aligned at regular intervals in the left-right direction. By this structure, the exhaust holes E1 and the exhaust holes E2 face each other in the vertical direction. In the example of the electronic apparatus 100, the first wall section 21a and the third wall section 23a have substantially the same length in the left-right direction. The exhaust holes E2 may be formed over the whole range of the first wall section 21a and the third wall section 20b or may be formed at part of the wall sections. Besides, the third wall section 23a and the first wall section 21a may be different in length. For example, the third wall section 23a may be shorter than the first wall section 21a. In this case, the exhaust holes E2 are formed in the range in which the third wall section 23a is formed.

As illustrated in FIG. 6, in the example of the electronic apparatus 100, the first wall section 21a and the partition wall sections 21b and 21c are formed at the rear wall section 21D of the armor frame 21. As depicted in FIG. 5A., the second wall section 20b rearwardly spaced from the first wall section 21a includes a wall section 21d formed at the rear wall section 21D of the armor frame 21 and a rear wall section 22D of the upper armor cover 22 disposed along the rear side of the wall section 21d. The third wall section 23a is an upper portion of the rear wall section 23D of the lower armor cover 23 rearwardly spaced from the first wall section 21a.

The wall sections 21a, 20b, 23a, 21b, and 21c constituting the exhaust holes E1 and E2 may be formed in any member of the armor frame 21, the upper armor cover 22, and the lower armor cover 23. For example, the wall sections 21a, 20b, 23a, 21b, and 21c may all be formed in the armor frame 21. In another example, the second wall section 20b and the partition wall section 21b may be formed in the upper armor cover 22, and the third wall section 23a and the partition wall section 21c may be formed in the lower armor cover 23. In addition, the structure of the exhaust holes E1 and E2 is also not limited to that in the example of the electronic apparatus 100. For example, as described later, the electronic apparatus may have plural exhaust holes aligned in the vertical direction and may have a partition wall section that partitions two exhaust holes adjacent to each other in the vertical direction.

The third air flow path S3 is connected to the exhaust holes E1 and E2. As mentioned above, the third air flow path S2 includes the case 42. As depicted in FIG. 5A, the case 42 includes an upper wall section 42a and a lower wall section 42b facing each other in the vertical direction. The upper wall section 42a extends to an upper edge of the second wall section 20b (more specifically, the wall section 21d of the armor frame 21). In addition, the armor frame 21 has a bottom wall section 21f formed along the left-right direction, at a lower edge of the partition wall section 21c on the lower side. A rear edge of the bottom wall section 21f reaches the third wall section 23a (an upper portion of the rear wall section 23D of the lower armor cover 23). A rear edge of the lower wall section 42b of the case 42 is connected to a front edge of the bottom wall section 21f of the armor frame 21 (see FIG. 6). Besides, left and right wall sections of the case 42 are connected to wall sections located at end portions of the exhaust holes E1 and E2. In this way, the third air flow path S3 (case 42) is connected to the exhaust holes E1 and E2. Air in the third air flow path S3 is discharged to the exterior through the exhaust holes E1 and E2, without leaking to other regions.

[Foreign Matter Preventing Member]

The foreign matter preventing member 70 will be described below.

As illustrated in FIG. 5A, the foreign matter preventing member 70 is located between the power source circuit 41, which is disposed in the air flow path and is one of the heat generating parts, and the exhaust holes E1 and E2. The foreign matter preventing member 70 is disposed along the exhaust holes E1 and E2. Specifically, the foreign matter preventing member 70 is disposed along the inside of the rear wall section 20D of the armor member 20 formed with the exhaust holes E1 and E2. The foreign matter preventing member 70 may be in contact with the rear wall section 20D or may be spaced from the rear wall section 20D. The foreign matter preventing member 70 is attached to the armor member 20 (in more detail, to the armor frame 21). Unlike in the example of the electronic apparatus 100, the foreign matter preventing member 70 may be attached to a member different from the armor member 20, for example, the case 42 of the power source unit 40. The attaching structure of the foreign matter preventing member 70 will be described in detail later.

Figure 7:
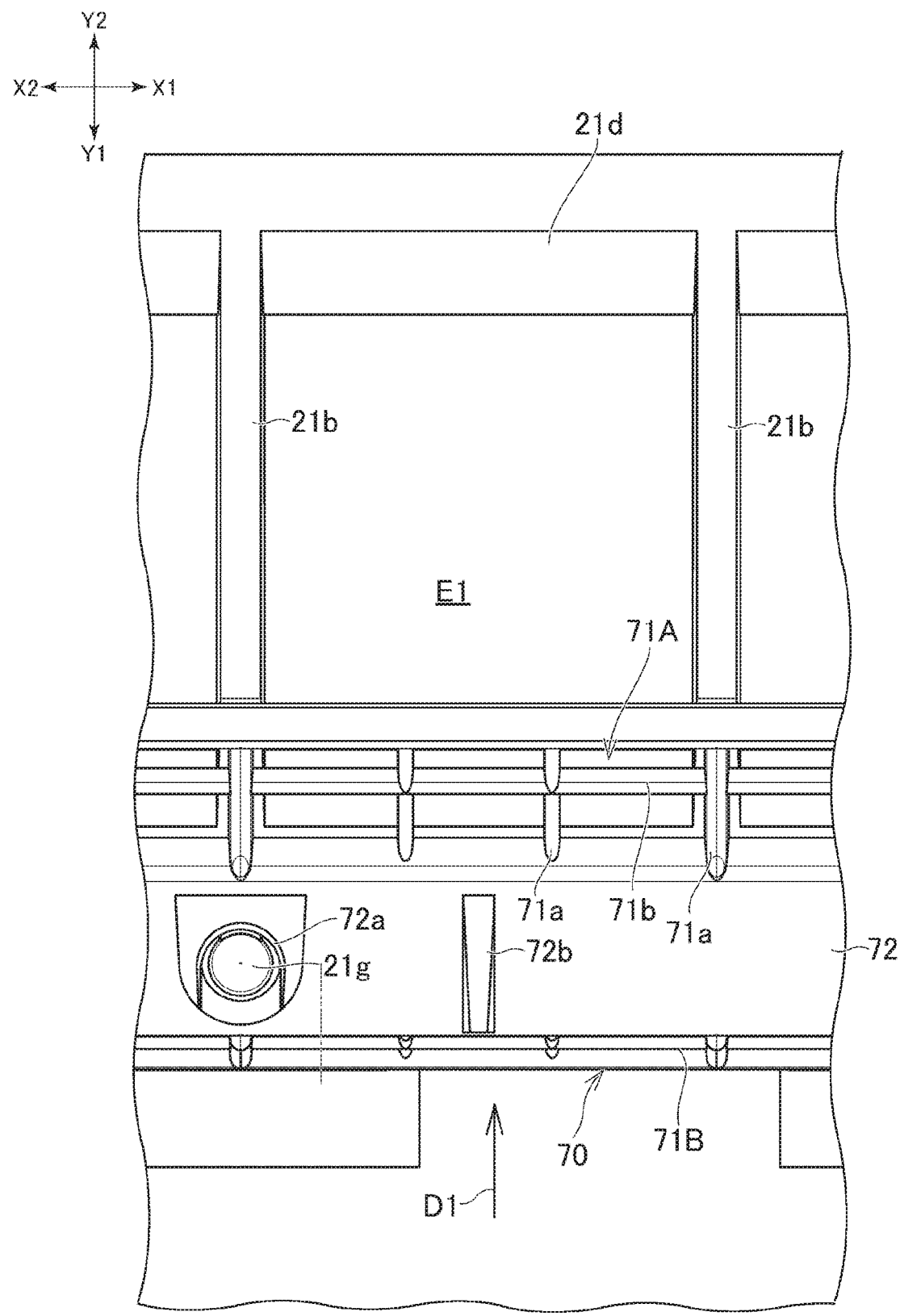
FIG. 7 is a plan view of the armor frame and the foreign matter preventing member.
Figure 8:
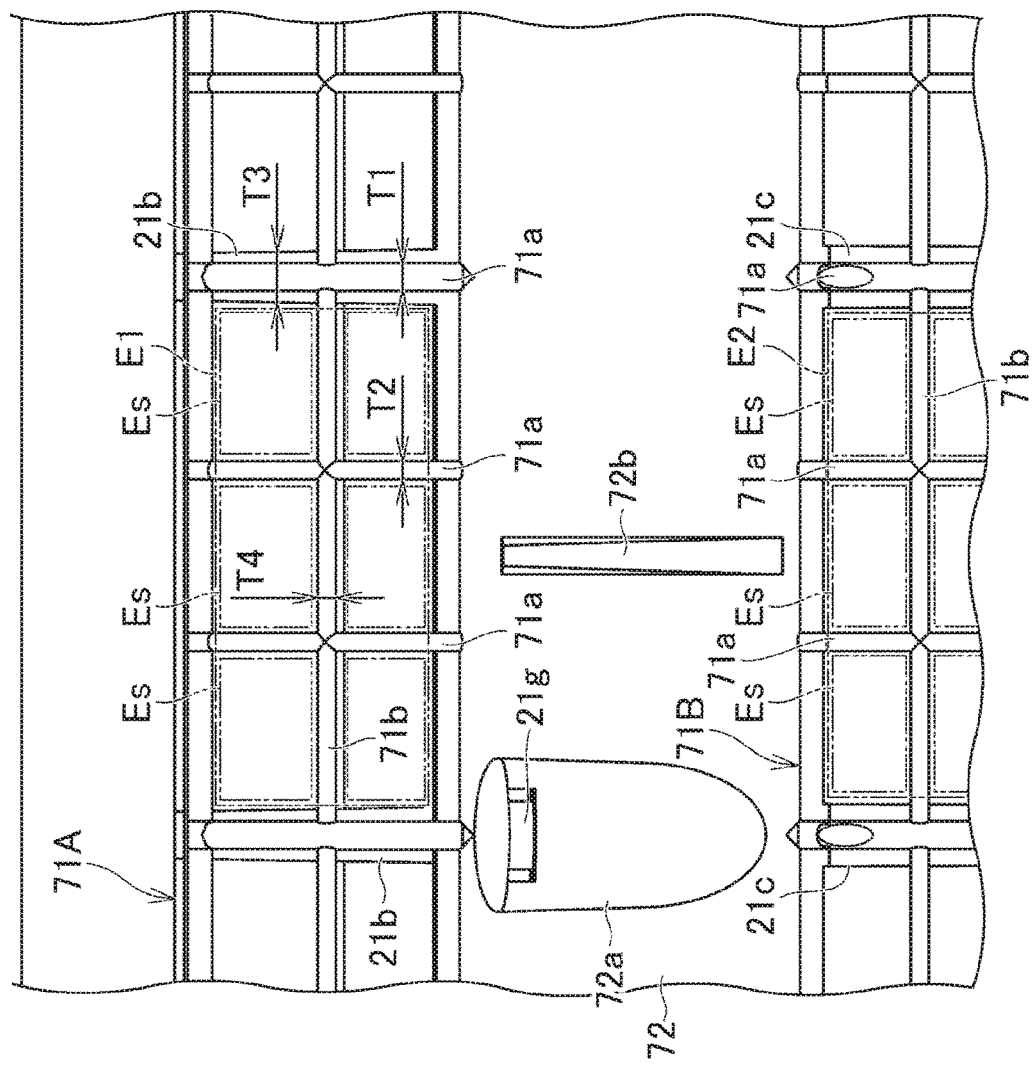
FIG. 8 is a front view of the armor frame and the foreign matter preventing member, that is, a diagram of viewing these two members in the direction indicated by an arrow VIII depicted in FIG. 7.

The foreign matter preventing member 70 is formed with plural openings Es partitioned by plural partition sections 71a and 71b (see FIG. 8). The partition sections 71a and the partition sections 71b extend respectively in two directions orthogonal to each other (specifically, in the vertical direction and the left-right direction). As depicted in FIG. 8, when the rear wall section 20D is viewed in the flow direction of air passing through the openings Es, the size of each opening Es is smaller than each of the exhaust holes E1 and E2 ("the flow direction of air passing through the openings Es" is rearward in the example of the electronic apparatus 100 and is the direction indicated by D1 in FIG. 7. Hereinafter, the D1 direction will be referred to as the "opening passing direction."). Besides, the size of plural openings Es corresponds to the size of one of the exhaust holes E1 and E2. In other words, each of the exhaust holes E1 and E2 is partitioned into the plural openings Es. With such a foreign matter preventing member 70, foreign matter having a size smaller than the exhaust holes E1 and E2 can be prevented from entering the air flow path S3 through the exhaust holes E1 and E2. In the example of the electronic apparatus 100, the plural openings Es are provided for all the exhaust holes E1 and E2. Unlike in the example of the electronic apparatus 100, the openings Es may be provided for only part of the exhaust holes E1 and E2.

The vertical size of the openings Es is, for example, equal to one half each of the exhaust holes E1 and E2 or smaller than one half each of the exhaust holes E1 and E2. The horizontal size of the openings Es is, for example, also equal to one half each of the exhaust holes E1 and E2, or smaller than one half each of the exhaust holes E1 and E2. As depicted in FIG. 8, in the example of the electronic apparatus 100, each of the exhaust holes E1 and E2 is partitioned into six openings Es. In each of the exhaust holes E1 and E2, three openings Es are aligned in the left-right direction, and two openings Es are aligned in the vertical direction.

The number and size of the openings Es are not limited to those in the example of the electronic apparatus 100. The number of the openings Es provided in each of the exhaust holes E1 and E2 may be more than six or may be less than six. In addition, the openings Es provided in each of the exhaust holes E1 and E2 may be aligned in only one of the left-right direction and the vertical direction. In other words, each of the exhaust holes E1 and E2 may be partitioned in only one of the left-right direction and the vertical direction.

The openings Es have a shape corresponding to the exhaust holes E1 and E2. Specifically, as illustrated in FIG. 8, when the rear wall section 20D is viewed in the opening passing direction D1 (see FIG. 7), the exhaust holes E1 and E2 are tetragonal, and the openings Es are also tetragonal. With the shape of the openings Es designed in this way, lowering in exhaust efficiency due to the foreign matter preventing member 70 can be reduced, as compared to a structure in which, for example, plural round openings Es are provided in the tetragonal exhaust holes E1 and E2. The shape of the exhaust holes E1 and E2 and the shape of the openings Es are not limited to those in the example of the electronic apparatus 100.

As illustrated in FIG. 6, the foreign matter preventing member 70 includes a first grid section 71A, a second grid section 71B, and an attached wall section 72. The grid sections 71A and 71B have vertical partition sections 71a (see FIG. 8) extending in the vertical direction and horizontal partition sections 71b (see FIG. 8) extending in the left-right direction, and the openings Es are formed in the grid sections 71A and 71B. The adjacent two openings Es are partitioned by the partition sections 71a and 71b.

As depicted in FIG. 8, the positions of the partition wall sections 21b and 21c in the left-right direction are coincident with the positions of the vertical partition sections 71a of the foreign matter preventing member 70. In other words, the partition wall sections 21b and 21c and the vertical partition sections 71a are aligned in the opening passing direction D1 (see FIG. 7). Owing to such a positional relation between the vertical partition sections 71a and the partition wall sections 21b and 21c, lowering in exhaust efficiency due to the foreign matter preventing member 70 can be reduced. The positional relationship between the vertical partition sections 71a and the partition wall sections 21b and 21c is not limited to that in the example of the electronic apparatus 100, and, for example, the partition wall sections 21b and 21c may be deviated from the positions of the vertical partition sections 71a in the left-right direction.

Note that the rear wall section 20D of the armor member 20 is formed with plural exhaust holes which are aligned in the vertical direction. Besides, the rear wall section 20D may have a partition wall section for partitioning the two exhaust holes adjacent to each other in the vertical direction. The positions of the partition wall sections may coincide with the positions of the horizontal partition sections 71b of the foreign matter preventing member 70. Owing to such a positional relation between the horizontal partition sections 71b and the partition wall sections, lowering in exhaust efficiency due to the foreign matter preventing member 70 can be reduced.

When the rear wall section 20D is viewed in the opening passing direction D1 (see FIG. 7), as depicted in FIG. 8, the thicknesses (diametrical sizes) T1 and T2 of the vertical partition sections 71a are smaller than the thickness T3 of the partition wall sections 21b and 21c formed in the rear wall section 20D. In detail, the thickness (diametrical size) T1 of the vertical partition sections 71a overlapping with the partition wall sections 21b and 21c and the thickness (diametrical size) T2 of the vertical partition sections 71a not overlapping with the partition wall sections 21b and 21c are both smaller than the thickness T3 of the partition wall sections 21b and 21c. As a result, lowering in exhaust efficiency due to the vertical partition sections 71a can be reduced.

In addition, as depicted in FIG. 8, in the example of the electronic apparatus 100, the thickness (diametrical size) T1 of the vertical partition sections 71a overlapping with the partition wall sections 21b and 21c is larger than the thickness (diametrical size) T2 of the vertical partition sections 71a not overlapping with the partition wall sections 21b and 21c. As a result, the strength of the grid sections 71A and 71B can be enhanced, while lowering in exhaust efficiency due to the vertical partition sections 71a is reduced.

The thicknesses (diametrical sizes) of the vertical partition sections 71a are not limited to those in the example of the electronic apparatus 100. For example, the thickness (diametrical size) T1 of the vertical partition sections 71a overlapping with the partition wall sections 21b and 21c may be equal to the thickness T3 of the partition wall sections 21b and 21c. As a further example, the thickness (diametrical size) T1 of the vertical partition sections 71a overlapping with the partition wall sections 21b and 21c may be equal to the thickness (diametrical size) T2 of the vertical partition sections 71a not overlapping with the partition wall sections 21b and 21c.

As illustrated in FIG. 8, when the foreign matter preventing member 70 is viewed in the opening passing direction D1 (see FIG. 7), the horizontal partition sections 71b of the foreign matter preventing member 70 have a thickness (diametrical size) T4. The thickness (diametrical size) T4 is, as is the case with the thicknesses (diametrical sizes) T1 and T2 of the vertical partition sections 71a, smaller than the thickness T3 of the partition wall sections 21b and 21c. As a result, lowering in exhaust efficiency due to the horizontal partition sections 71b can be reduced. In the example of the electronic apparatus 100, the thickness (diametrical size) T4 of the horizontal partition sections 71b is substantially the same as the thickness (diametrical size) T2 of the vertical partition sections 71a. Therefore, the thickness (diametrical size) T4 of the horizontal partition sections 71b is smaller than the thickness (diametrical size) T1 of the vertical partition sections 71a overlapping with the partition wall sections 21b and 21c.

Note that the rear wall section 20D of the armor member 20 may be formed with plural exhaust holes which are aligned in the vertical direction. Besides, the rear wall section 20D may have a partition wall section that partitions the two exhaust holes adjacent to each other in the vertical direction. In this case, the thickness (diametrical size) T4 of the horizontal partition sections 71b may be smaller than the thickness of the partition wall sections.

Figure 5B:
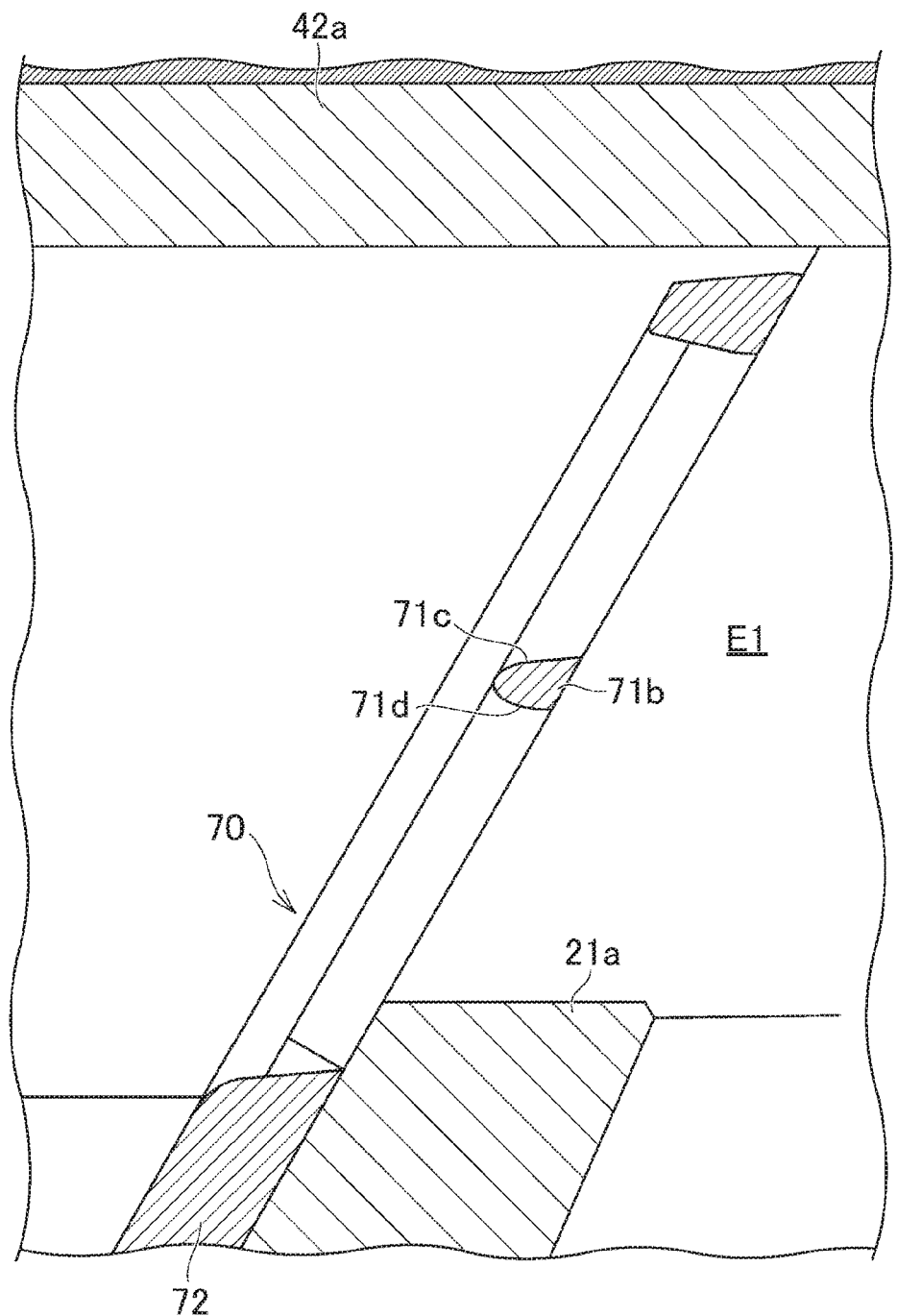
FIG. 5B is an enlarged view of FIG. 5A.

As depicted in FIG. 5B, the horizontal partition section 71b has an upper surface 71c and a lower surface 71d. The distance between the upper surface 71c and the lower surface 71d, that is, the thickness (diametrical size) of the horizontal partition section 71b, gradually decreases in going upstream of the air flow path. In other words, the thickness (diametrical size) of the horizontal partition section 71b gradually decreases in going toward the inside of the armor member 20. By this structure, lowering in exhaust efficiency due to the horizontal partition sections 71b can be reduced.

Note that the vertical partition section 71a has a right surface and a left surface. The distance between the right surface and the left surface, that is, the thickness (diametrical size) of the vertical partition section 71a, also gradually decreases in going upstream of the air flow path. In other words, the thickness (diametrical size) of the vertical partition section 71a gradually decreases in going toward the inside of the armor member 20. By this structure, lowering in exhaust efficiency due to the vertical partition sections 71a can be reduced.

The foreign matter preventing member 70 is a part formed from a resin. In other words, the foreign matter preventing member 70 is a molding of a resin. The armor member 20 (that is, the armor frame 21, the upper armor cover 22, and the lower armor cover 23) is also a part formed from a resin. As a result, attachment of the foreign matter preventing member 70 to the armor member 20 can be facilitated, as compared to the case where a net formed from fibers, for example, is used as the foreign matter preventing member 70. The materials for the foreign matter preventing member 70 and the armor member 20 are, for example, polyamides, polypropylene, ABS (Acrylonitrile Butadiene Styrene) resin or the like. The foreign matter preventing member 70 is a member formed separately from the armor member 20. In addition, the foreign matter preventing member 70 is a member formed separately from also the case 42 of the power source unit 40. As a result, it is easy to form the partition sections 71a and 71b small in thickness (diametrical size). Here, the phrase which reads "the foreign matter preventing member 70 is formed separately" means that the foreign matter preventing member 70 is formed in a step other than the step of forming the armor member 20 such as the armor frame 21 by use of a mold.

The foreign matter preventing member 70 is disposed inside the armor member 20. As illustrated in FIG. 5A, the foreign matter preventing member 70 is attached to the rear wall section 20D of the armor member 20 and is in contact with the rear wall section 20D. The foreign matter preventing member 70 is attached to parts between the plural exhaust holes E1 and E2 formed in the rear wall section 20D. More in detail, the rear wall section 20D has the abovementioned first wall section 21a, between the plural exhaust holes E1 aligned in the left-right direction and the plural exhaust holes E2 aligned in the left-right direction. The foreign matter preventing member 70 has the attached wall section 72 (see FIG. 6) between the first grid section 71A and the second grid section 71B. As depicted in FIG. 5A, the attached wall section 72 is disposed along the first wall section 21a and is attached to the first wall section 21a. By this attaching structure, it is possible to prevent generation of a gap due to flexure of the foreign matter preventing member 70, between the grid sections 71A and 71B of the foreign matter preventing member 70 and the partition wall sections 21b and 21c. As a result, penetration of foreign matter through the gap between the grid sections 71A and 71B and the partition wall sections 21b and 21c can be restrained effectively.

As illustrated in FIG. 5A, the first grid section 71A is disposed along a front edge 21i (see FIG. 6) of the partition wall section 21b that partitions the adjacent two exhaust holes E1. The first grid section 71A is in contact with the front edge 21g of the partition wall section 21b. The second grid section 71B is disposed along a front edge 21h (see FIG. 6) of the partition wall section 21c that partitions the adjacent two exhaust holes E2. The second grid section 71B is in contact with the front edge 21h of the partition wall section 21c.

As illustrated in FIG. 6, the first wall section 21a of the armor member 20 is formed with rod-shaped attaching sections 21g which extend upward. The plural attaching sections 21g are aligned in the left-right direction. On the other hand, the attached wall section 72 of the foreign matter preventing member 70 is formed with attached sections 72a in a tubular shape opening downward. The plural attached sections 72a are aligned in the left-right direction. The attaching sections 21g are fitted to the inside of the attached sections 72a and are fixed to the attached sections 72a by welding, for example. For example, after the attaching sections 21g are fitted to the inside of the attached sections 72a, upper ends of the attaching sections 21g are fixed to the attached sections 72a by heat (in FIG. 8, the upper ends of the attaching sections 21g that have been thermally deformed are depicted.). Thus, the foreign matter preventing member 70 is attached to the first wall section 21a in the vertical direction. The attaching structure for the foreign matter preventing member 70 is not limited to that in the example of the electronic apparatus 100. For example, the foreign matter preventing member 70 may be attached to the rear wall section 20D by fastening means such as screws.

As illustrated in FIG. 7, in plan view of the electronic apparatus 100, the attached sections 72a and the attaching sections 21g are located on the front side of the partition wall sections 21b and 21c. In other words, the attached sections 72a, the attaching sections 21g, and the partition wall sections 21b and 21c are aligned in the opening passing direction D1. The positions of the attached sections 72a and the attaching sections 21g are not limited to those in the example of the electronic apparatus 100. For example, the foreign matter preventing member 70 may be attached to the partition wall sections 21b and 21c. In this case, the attaching structure (for example, projections) for the foreign matter preventing member 70 may be formed at the front edges 21i and 21h of the partition wall sections 21b and 21c, for example.

As depicted in FIG. 6, the attached wall section 72 of the foreign matter preventing member 70 is formed with plural ribs 72b. By the ribs 72b, strength of the foreign matter preventing member 70 can be increased. The ribs 72b may be used in a step of attaching the foreign matter preventing member 70 to the rear wall section 20D. For example, the ribs 72b may be pressed by a jig in a state in which the attaching sections 21g are fitted to the attached sections 72a, and the position of the foreign matter preventing member 70 may be fixed. Thereafter, the attaching sections 21g may be welded to the attached sections 72a.

[Summary]

As described above, the electronic apparatus 100 includes the armor member 20, the plural exhaust holes E1 and E2 formed in the armor member 20, the air flow path S3 formed inside the armor member 20 and connected to the plural exhaust holes E1 and E2, the power source circuit 41 disposed in the air flow path S3, and the foreign matter preventing member 70 located between the power source circuit 41 and the plural exhaust holes E1 and E2. The foreign matter preventing member 70 is formed with the plural openings Es. Each of the openings Es is smaller in size than each of the exhaust holes E1 and E2. According to the electronic apparatus 100, foreign matter can be restrained from entering the inside of the electronic apparatus 100. In addition, since the foreign matter preventing member 70 is a member formed separately from the armor member 20, it is easy to reduce the thickness (diametrical size) of the partition sections 71a and 71b for partitioning the openings Es and to reduce lowering in exhaust efficiency.

[Modifications]

The electronic apparatus proposed in the present disclosure is not limited to the abovementioned electronic apparatus 100.

Figure 9:
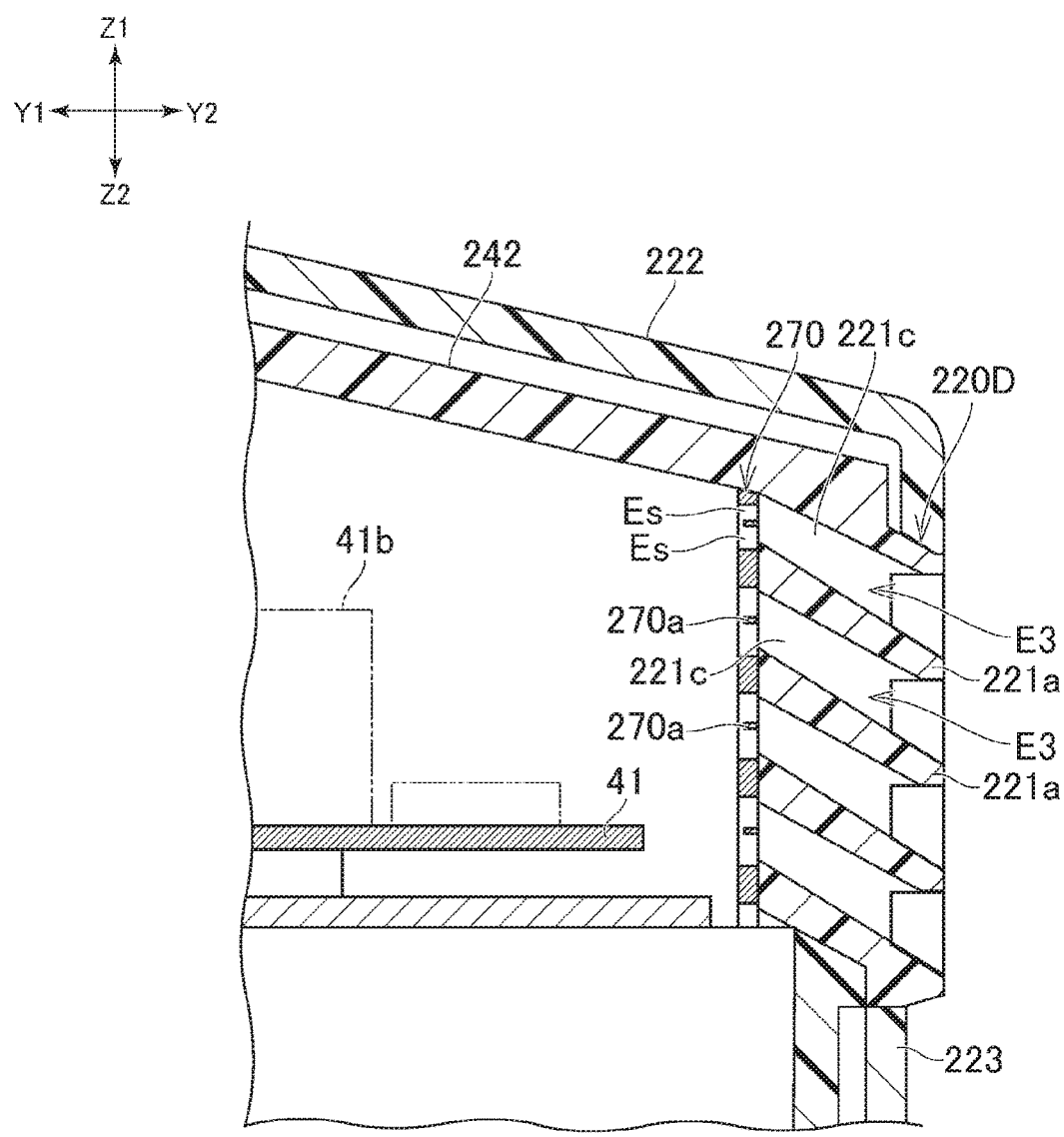
FIG. 9 is a sectional view depicting a modification of exhaust holes and the foreign matter preventing member.

FIG. 9 is a diagram depicting a modification, and a section of a rear wall section 220D is illustrated in the drawing. The rear wall section 220D is a rear wall of a case 242 for a power source unit 240. In other words, in the electronic apparatus of FIG. 9, a rear wall of a housing 222 is formed with an opening, and the rear wall section 220D of the case 242 is exposed through the opening. Therefore, the rear wall section 220D of the case 242 is also a part of the armor member.

In the rear wall section 220D, denoted are plural exhaust holes E3 which are aligned in the vertical direction. The two exhaust holes E3 adjacent to each other in the vertical direction are partitioned by a partition wall (louver) 221a. The partition wall section 221a is inclined with respect to the front-rear direction, whereby the inside of the electronic apparatus is restrained from being exposed on or visible from the exterior. In addition, in the rear wall section 220D, the plural exhaust holes E3 are aligned also in the left-right direction, and the two exhaust holes E3 adjacent to each other in the left-right direction are partitioned by a partition wall section 221c. A foreign matter preventing member 270 is disposed inside the rear wall section 220D. The foreign matter preventing member 270 as a whole is formed in a grid shape. Each of the exhaust holes E3 is partitioned by a partition section 270 into plural openings Es.

As a further example, the foreign matter preventing member 70 may be attached to an inner surface of an armor member 20, not through an attached wall section 72 but through an outer peripheral edge of the foreign matter preventing member 70.

In addition, the foreign matter preventing member 70 is not required to be a molding formed by use of a mold. For example, the foreign matter preventing member 70 may be a sheet formed with plural through-holes (openings Es). In a further example, the foreign matter preventing member 70 may be a mesh formed by weaving fibers.

In a further example, the material for the foreign matter preventing member 70 may be a metal.

In the example of the electronic apparatus 100, partition sections 71a and 71b of the foreign matter preventing member 70 extend in the vertical direction and the left-right direction. Unlike in the example of the electronic apparatus 100, the partition sections 71a and 71b may extend in a direction inclined in both the vertical direction and the left-right direction.

As a further example, the foreign matter preventing member 70 may be formed integrally with the case 42 of the power source unit 40 or the armor member 20. In other words, the foreign matter preventing member 70 may be a part of the armor member.

As a further example, the foreign matter preventing member 70 may be provided in an intake hole of the electronic apparatus.

In the example of the electronic apparatus 100, the foreign matter preventing member 70 is disposed between a power source circuit 41 and exhaust holes E1 and E2. In other words, the foreign matter preventing member 70 is located downstream of the power source circuit 41. A foreign matter preventing member may be disposed also upstream of the power source circuit 41 (here, the foreign matter preventing member disposed upstream is referred to as a "second foreign matter preventing member." Here, "upstream of the power source circuit 41" means a flow path on the intake hole A (see FIG. 1) side relative to the power source circuit 41.). According to this structure, foreign matter having entered the air flow path via the intake hole A can be restrained from moving in the air flow path to reach the power source circuit 41. The second foreign matter preventing member is, for example, a heat sink in contact with an integrated circuit such as a CPU or a GPU. The second foreign matter preventing member may be a special-purpose member having a part formed in a grid shape, as is the case with the foreign matter preventing member 70 described with reference to FIG. 6 and the like. In the case where the second foreign matter preventing member is a member having a part formed in the grid shape, the position of the second foreign matter preventing member may be selected, as required, in the upstream relative to the power source circuit 41.

Figure 12:
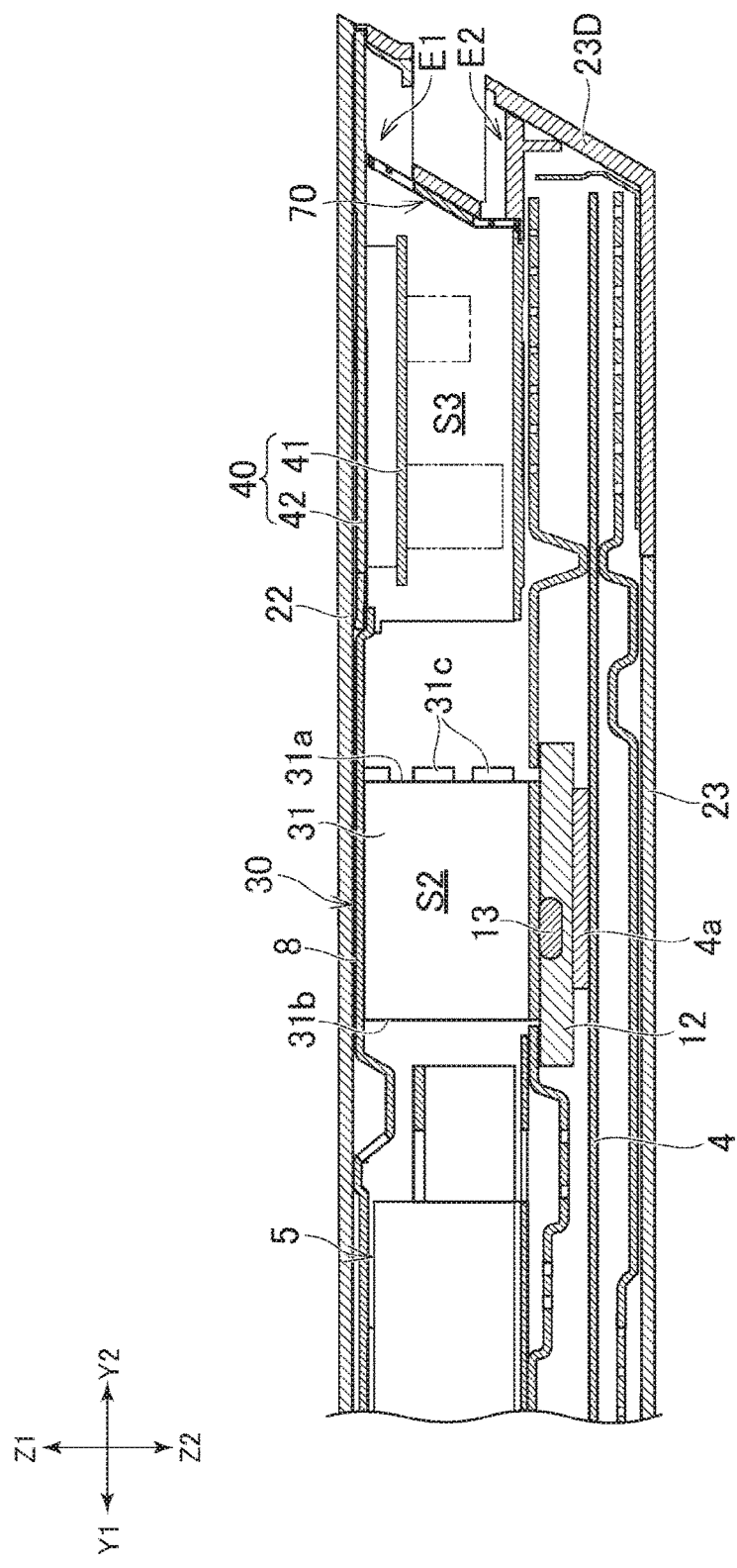
FIG. 12 is a sectional view depicting the layout of a power source circuit, the foreign matter preventing member, and the heat sink depicted in FIG. 10A, in which the section is indicated by line XII-XII in FIG. 3.

In the electronic apparatus 100, a heat sink 30 (see FIG. 12) is disposed in a second air flow path S2 located upstream of the power source circuit 41. As will be described later, the heat sink 30 has plural fins 31 (wall sections) aligned in one direction. In the case where the heat sink 30 functions as the second foreign matter preventing member, for example, a partition (for example, a partition 31d denoted in FIG. 10C) located between the adjacent two fins is provided at an edge of the fin 31 of the heat sink 30. By this partition, the air flow path between the adjacent two fins is partitioned into smaller flow paths. By this structure, foreign matter smaller than the air flow path between the two fins can be prevented from entering the power source circuit 41 by passing through the heat sink. Such a partition may be formed integrally with the fin, or a grid-shaped member constituting plural partitions may be attached to the edge of the fin.

An example of the heat sink which can function as the second foreign matter preventing member will be described below referring to FIGS. 10A to 10C.

[Heat Sink 1]

As illustrated in FIG. 10A, the heat sink 30 has plural fins 31 aligned at regular intervals in the left-right direction. In addition, the heat sink 30 has a plate-shaped base 32 at a bottom portion thereof. The plural fins 31 are rising on an upper surface of the base 32. The fin 31 is a metallic plate, and a lower edge 31f (see FIG. 10C) of the fin 31 is fixed to the upper surface of the base 32 by solder, for example. The fins 31 may be disposed perpendicularly to the direction (left-right direction) in which the fins 31 are aligned or may be inclined relative to the direction in which the fins 31 are aligned. Besides, a heat pipe 33 may be attached to the base 32. For example, the upper surface of the base 32 may be formed with a groove, and the heat pipe 33 may be disposed in the groove. The materials for the fins 31 and the base 32 are, for example, metals having good heat transfer characteristic such as aluminum, iron, and copper.

An air flow path S31 (see FIG. 10) in the direction along the fins 31 is formed between the adjacent two fins 31. In an example of use of the heat sink 30, an airflow is formed in the front-rear direction. Each fin 31 has edges 31a and 31b (see FIG. 10A) which are located on opposite sides in the front-rear direction (in this description, the edge 31b is referred to as a "front edge" and the edge 31a is referred to as a "rear edge."). The edges 31a and 31b are edges extending in a direction intersecting a lower edge 31f fixed to the base 32. More specifically, the edges 31a and 31b are edges extending in a direction orthogonal to the lower edge 31f.

A rear edge 31a of each fin 31 is formed with plural partition sections 31d (see FIG. 10B) aligned at intervals in the vertical direction. As illustrated in FIG. 10C, when the heat sink 30 is viewed in the front-rear direction, the partition section 31d is located between the rear edges 31a of the adjacent two fins 31. The partition section 31d is located between an upper edge 31e and a lower edge 31f of the fin 31. Therefore, when the heat sink 30 is viewed in the front-rear direction, an air flow path S31 formed over a range from the upper edge 31e to the lower edge 31f between the adjacent two fins 31 is partitioned by the partitions 31d into air flow paths S32 smaller than the air flow path S31. In other words, when the heat sink 30 is viewed in the front-rear direction, a gap between the rear edges 31a of the adjacent two fins 31 is partitioned by the partition 31d. As a result, foreign matter smaller than the air flow path S31 can be prevented from passing through the air flow path S31. The air flow paths S32 are smaller than one half the air flow path S31. In the example of the heat sink 30, the rear edge 31a is formed with four partition sections 31d, and one air flow path S1 is partitioned into five air flow paths S2. In the example of the heat sink 30, the plural partition sections 31d are disposed substantially evenly between the upper edge 31e and the lower edge 31f of the fin 31. The distance between the two partition sections 31d aligned in the vertical direction is larger than the distance between the adjacent two fins 31.

Note that the intervals of the partition sections 31d may not necessarily be even. In addition, the number of the partition sections 31d formed in each fin 31 may be less than four or may be more than four. For example, the number of the partition sections 31d may be one. Besides, while all the fins 31 are formed with the partition sections 31d in the example of the heat sink 30, the partition sections 31d may be formed on only part of the fins 31 possessed by the heat sink 30.

The partition sections 31d are parts formed integrally with the fins 31. In other words, the partition section 31d is not a part attached to the fin 31 by fixing means such as solder or screws. Each fin 31 is a metallic plate. The fins 31 are formed, for example, by stamping of a metallic plate having a size corresponding to plural fins. The partition section 31d is a bent part of a plate (see FIG. 10B). This makes it possible to facilitate the production of the heat sink, as compared to a heat sink in which, for example, other members constituting the partition sections 31d are attached to rear edges 31a of the plural fins 31.

The plural fins 31 possessed by the heat sink 30 have the same shape. Therefore, in the plural fins 31, the height (the height from the base 32) of the partition sections 31d is the same. Therefore, the partition sections 31d formed in the plural fins 31 are aligned in the left-right direction. This makes it possible to decrease the cost required for producing the fins 31. In the example of the heat sink 30, the plural partition sections 31d are aligned in one row in the left-right direction. Since each fin 31 is formed with the plural partition sections 31d, the heat sink 30 has a plural rows aligned in the vertical direction, in regard of the partition sections 31d.

Figure 10B:
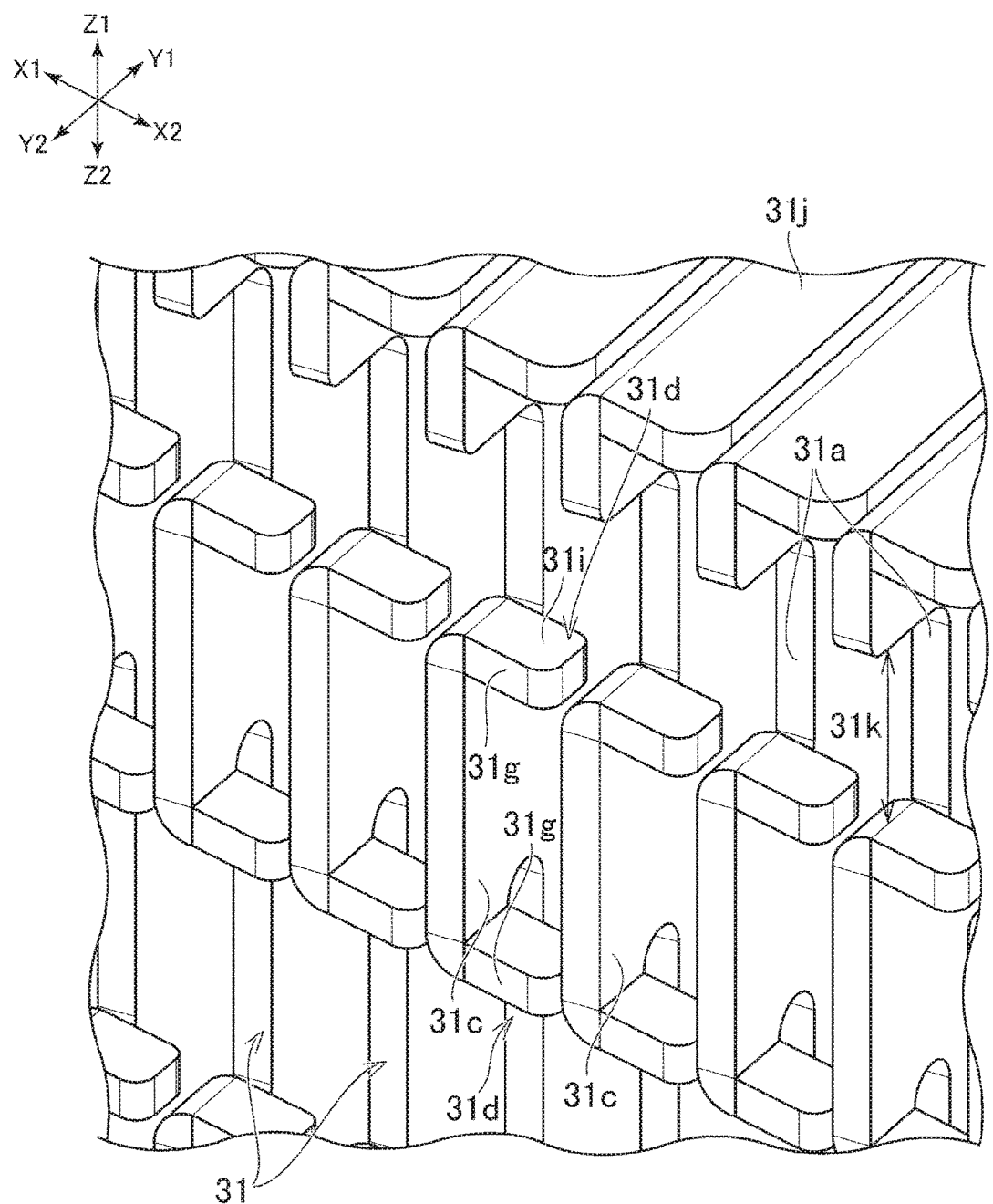
FIG. 10B is an enlarged perspective view of the heat sink depicted in FIG. 10A.

As illustrated in FIG. 10B, the rear edge 31a of each fin 31 is formed with a plural recesses 31k. Each fin 31 has a projection 31c between the recesses 31k. The projection 31c is a small plate-shaped part and is formed such that its thickness direction is parallel to the direction in which the fins 31 are aligned. The partition section 31d is formed at an end portion in the vertical direction of the projection 31c (at an edge of the recess 31k). In the example of the heat sink 30, each fin 31 is formed with two projections 31c (see FIG. 10C), and two partition sections 31d extend from one projection 31c. The two partition sections 31d are bent at an upper edge and a lower edge of the projection 31c. In other words, the partition section 31d is bent, with an edge of the projection 31c along the front-rear direction as a center. Besides, the partition section 31d extends toward the adjacent fin 31. In the example of the heat sink 30, the partition section 31d is bent to the left side. Therefore, the two partition sections 31d and the projection 31c are in a substantially U shape opening to the left side.

As depicted in FIG. 10B, due to the abovementioned bending of the partition section 31d, an end surface 31g of the partition section 31d faces rearward (the end surface 31g is a part of an end surface of a plate constituting the fin 31. In other words, the end surface 31g is a surface defining the thickness of the partition section 31d.). Therefore, a surface 31i of the partition section 31d is faced in a direction orthogonal to the front-rear direction (in the example of the heat sink 30, in the vertical direction). For this reason, air resistance caused by the partition section 31d can be reduced, as compared to the case where the partition section 31d is bent such that the surface 31i faces rearward (the direction of an airflow). Note that due to the abovementioned bending of the partition section 31d, the height h1 (see FIG. 10C) of the partition section 31d is smaller than the length L1 in the left-right direction of the partition section 31d. Since the height h1 of the partition section 31d is thus small, the area occupied by the air flow paths S32 in the air flow path S31 can be enlarged. In the example of the heat sink 30, the height (the width in the vertical direction) of the air flow path S32 is larger than the distance between the adjacent two fins 31.

Note that in the example of the heat sink 30, the partition sections 31d of all the fins 31 are bent in the same direction. In other words, the partition sections 31d of all the fins 31 are bent to the left side. Unlike in the example of the heat sink 30, the heat sink may have partition sections differing in bending direction. For example, the partition section 31d connected to the upper edge of the projection 31c may be bent to the left side, while the partition section connected to the lower edge of the projection 31c may be bent to the right side.

In addition, in the example of the heat sink 30, the projection 31c and the partition section 31d are not provided at the front edge 31b of the fin 31. Therefore, the front edge 31b is formed rectilinearly along the vertical direction. Unlike in the example of the heat sink 30, the fin 31 may have the projection 31c and the partition section 31d also at the front edge 31b thereof.

Figure 10C:
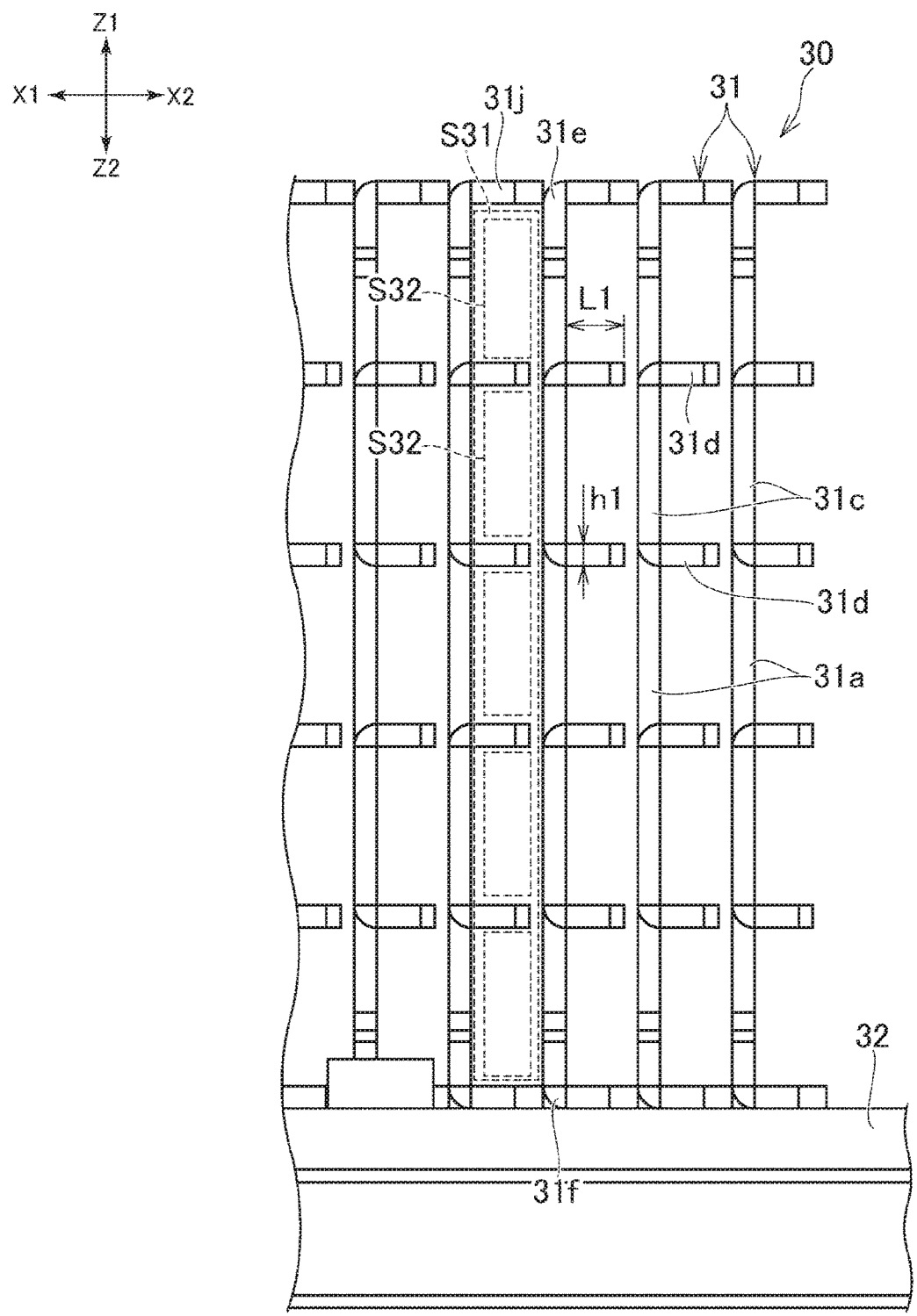
FIG. 10C is a front view of viewing the heat sink depicted in FIG. 10A in the direction along fins.

As illustrated in FIG. 10C, each fin 31 has, at its upper edge 31e, a connection section 31j bent toward the adjacent fin 31. The connection section 31j is connected to the upper edge 31e of the adjacent fin 31. The connection section 31j may have a part which is caught on the upper edge 31e of the adjacent fin 31. The connection section 31j is only required to be in contact with the upper edge 31e of the adjacent fin 31.

The connection section 31j and the partition section 31d are bent in the same direction. In the example of the heat sink 30, the partition section 31d and the connection section 31j are bent to the left side. According to such a fin 31, formation of the fin 31 can be simplified. For example, the partition section 31d and the connection section 31j can be formed by one bending operation.

In addition, in the example of the heat sink 30, the connection section 31j is formed over the whole part of the upper edge 31e. In other words, the connection section 31j is continuous from a front end to a rear end of the upper edge 31e. This makes it possible to increase the area of the fin 31 and to enhance cooling performance of the heat sink 30. The shape of the fin 31 is not limited to that in the example of the heat sink 30. In other words, the partition section 31d and the connection section 31j may be bent in opposite directions. In addition, the connection section 31j may be formed at only part of the upper edge 31e of the fin 31.

As described above, the connection section 31j is connected to the upper edge 31e of the adjacent fin 31. On the other hand, the length L1 (see FIG. 10C) of the partition section 31d is smaller than the distance between the adjacent two fins 31. Therefore, when the heat sink 30 is viewed in the front-rear direction, there is a gap between the partition section 31d and the adjacent fin 31. This makes it possible to facilitate reduction of noise in the electronic apparatus in which the heat sink 30 is mounted. Specifically, in the case where the partition section 31d is set to such a length as to reach the adjacent fin 31, the partition section 31d making contact with the adjacent fin 31 and the partition section 31d not making contact with the adjacent fin 31 are generated, due to tolerance of the heat sink 30. This makes it difficult, for example, to decrease the noise caused by unrequired radiation. On the other hand, in the example of the heat sink 30, the length L1 of the partition section 31d is smaller than the distance between the adjacent two fins 31, and, therefore, in regard of every one of the partition sections 31d, the contact with the adjacent fin 31 can be avoided securely. As a result, for example, decrease of the noise caused by unrequired radiation can be facilitated.

[Heat Sink 2]

A heat sink 130 will be described as a second example of the heat sink proposed in the present disclosure, referring to FIGS. 11A to 11C. Note that in FIGS. 11A to 11C, the same parts as the heat sink 30 described referring to FIG. 10A and the like are denoted by the same reference signs. In the following, description will be centered on the differences between the heat sink 10 and the heat sink 130. The items not described in regard of the heat sink 130 are similar to those in regard of the heat sink 30.

Figure 11A:
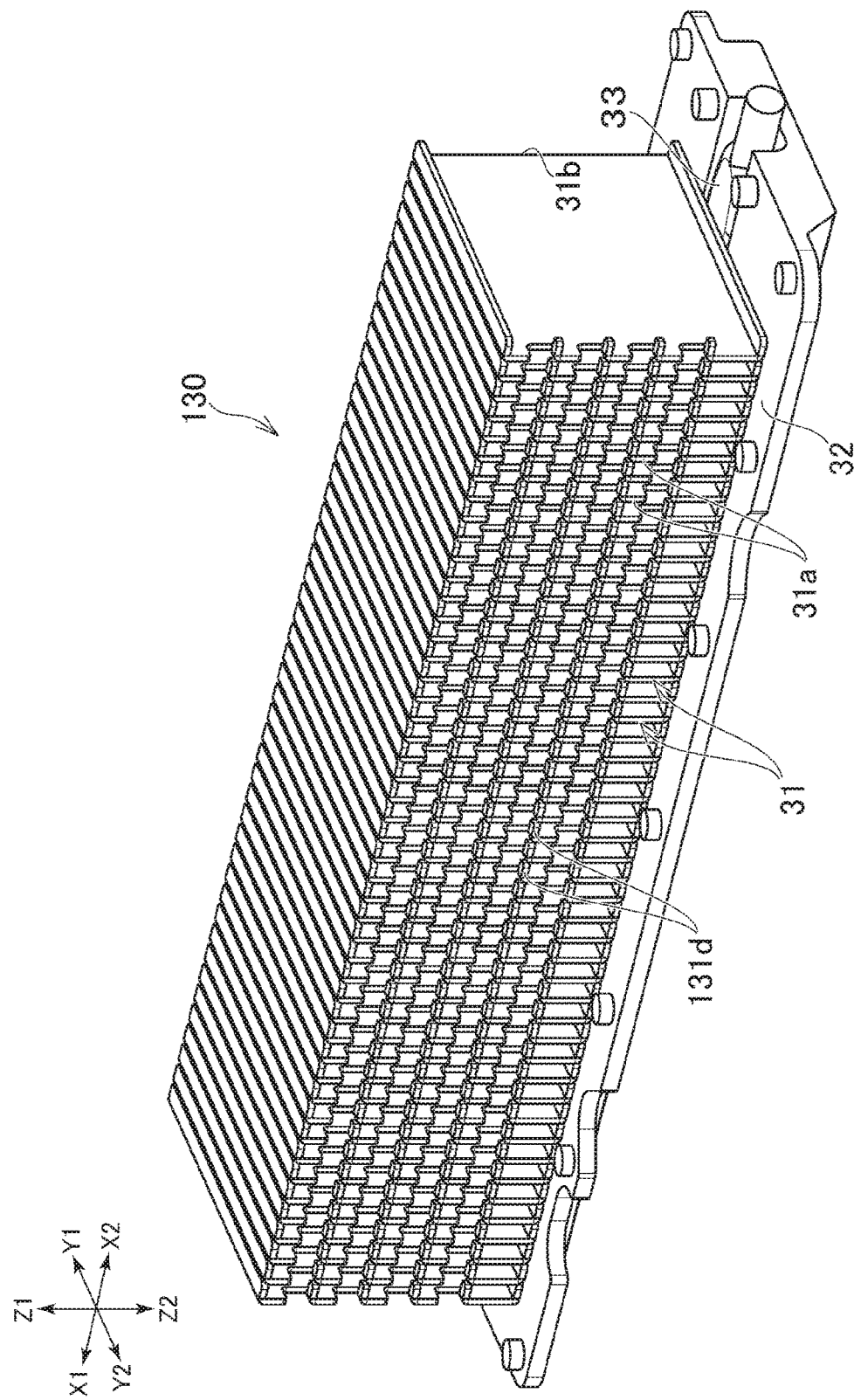
FIG. 11A is a perspective view depicting another example of the heat sink capable of functioning as the second foreign matter preventing member.

As illustrated in FIG. 11A, the heat sink 130 has plural fins 31. At a rear edge 31a of each fin 31, there are formed plural partition sections 131d (see FIG. 11B) which are aligned at intervals in the vertical direction. As depicted in FIG. 11C, when the heat sink 130 is viewed in the front-rear direction, the partition section 131d is located between the rear edges 31a of the adjacent to fins 31. In addition, similarly to the partition section 31d depicted in FIG. 10C and the like, the partition section 131d is located between an upper edge 31e and a lower edge 31f of the fin 31. Therefore, when the heat sink 130 is viewed in the front-rear direction, an air flow path S31 between the adjacent two fins 31 is partitioned by the partition sections 131d into air flow paths S32 smaller than the air flow path S31. In other words, a gap between rear edges 31a of the adjacent two fins 31 is partitioned by the partition sections 131d. This makes it possible to prevent foreign matter smaller than the air flow path S31 from passing through the air flow path S31.

In the example of the heat sink 130, four partition sections 131d are provided at the rear edge 31a, and one air flow path S31 is partitioned into five air flow paths S32. The plural partition sections 131d are disposed substantially evenly between the upper edge 31e and the lower edge 31f of the fin 31. The number of the partition sections 131d formed on each fin 31 may be less than four or may be more than four. For example, the number of the partition sections 131d may be one.

Figure 11B:
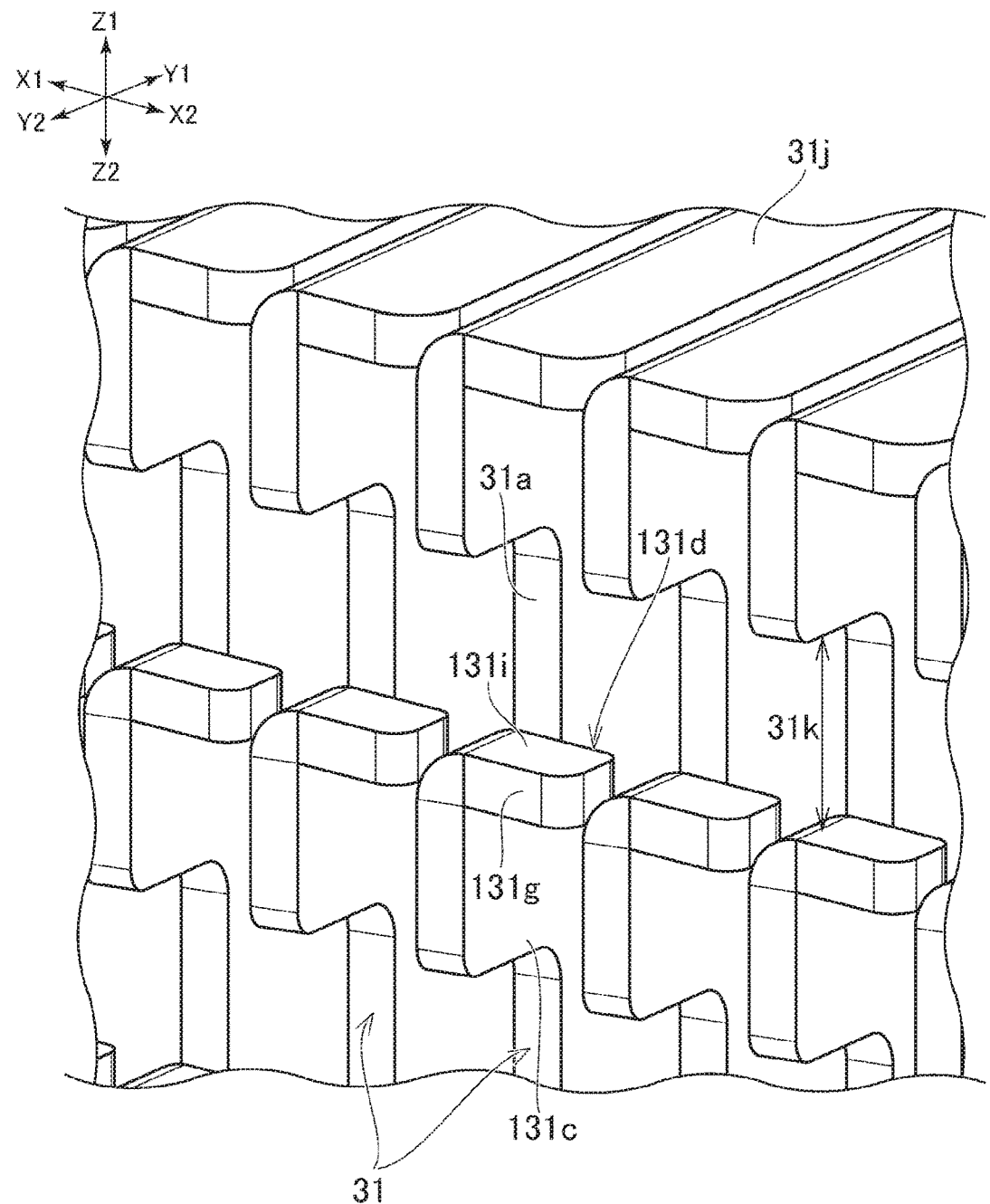
FIG. 11B is an enlarged perspective view of the heat sink depicted in FIG. 11A.
Figure 11C:
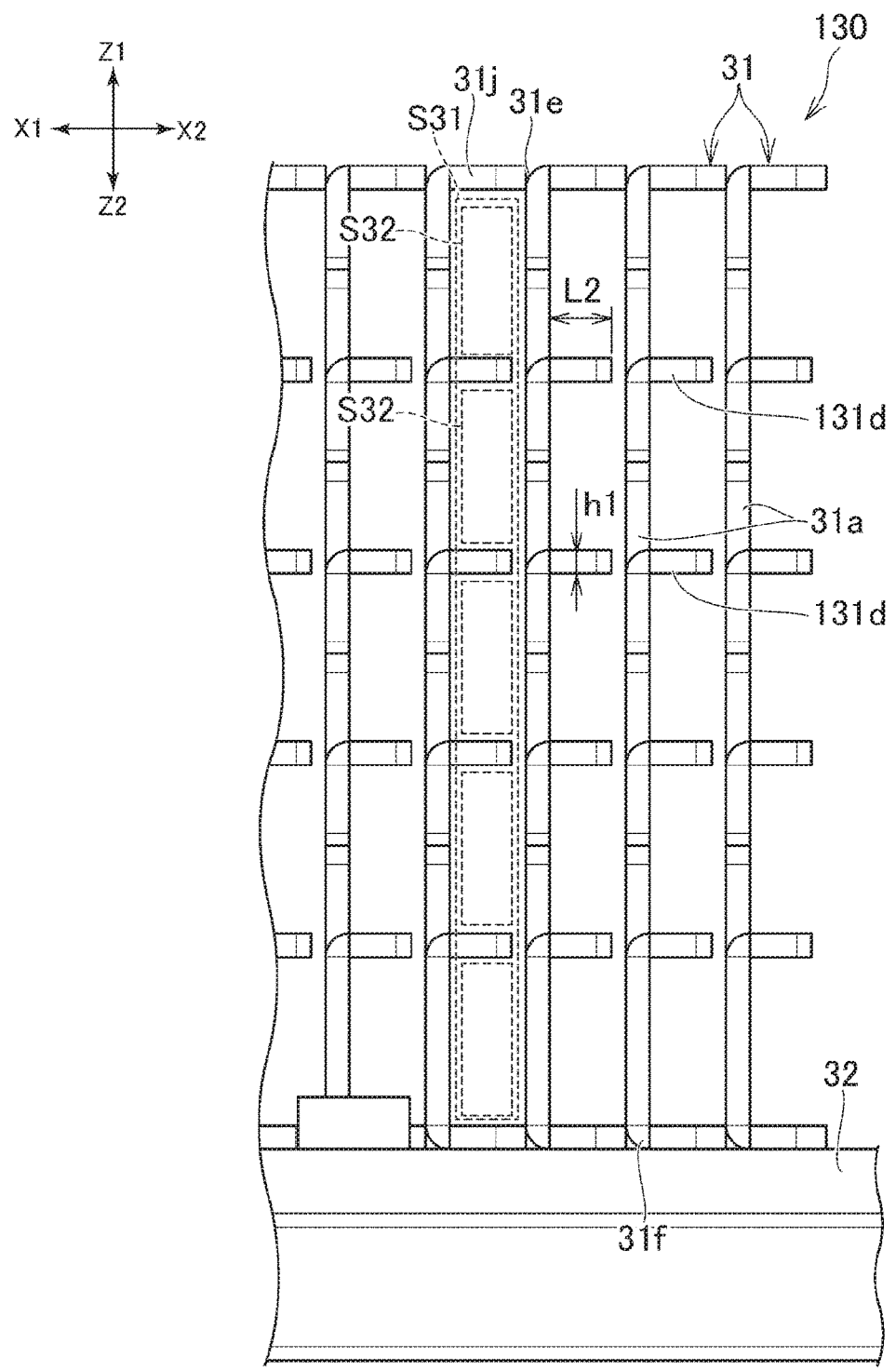
FIG. 11C is a front view viewing the heat sink depicted in FIG. 11A in the direction along the fins.

As illustrated in FIG. 11B, the rear edge 31a of each fin 31 is formed with recesses 31k. Each fin 31 has a projection 131c between the two recesses 31k aligned in the vertical direction. The projection 131c is a small plate-shaped part and is formed such that its thickness direction is parallel to the direction in which the fins are aligned. In the example of the heat sink 130, unlike in the heat sink 30, only one partition section 131d extends from one projection 131c. In other words, the partition section 131d is bent at one edge of an upper edge and a lower edge of the projection 131c and is not formed at the other edge. In the example depicted in FIG. 11B, the partition section 131d is bent at the upper edge of the projection 131c. Besides, the partition section 131d extends toward the adjacent fin 31. In the example of the heat sink 130, the partition section 131d extends leftward. Therefore, when viewed in the front-rear direction, the partition section 131d and the projection 131c are in a substantially L shape (see FIG. 11C). Contrary to the example of the heat sink 130, the partition section 131d may be formed at the lower edge of the projection 131c and may not be formed at the upper edge of the projection 131c.

As illustrated in FIG. 11B, due to the abovementioned bending of the partition section 131d, an end surface 131g of the partition section 131d faces rearward. Therefore, a surface 131i of the partition section 131d is faced in a direction orthogonal to the front-rear direction (in the example of the heat sink 10, in the vertical direction). For this reason, air resistance caused by the partition section 131d can be reduced, as compared to such a bending that the surface 131i faces rearward.

Note that, also in the example of the heat sink 130, in regard of every one of the fins 31, the partition sections 131d are bent in the same direction. In other words, the partition sections 131d of all the fins 31 are bent to the left side.

Besides, also in the example of the heat sink 130, the projection 131c and the partition section 131d are not provided at the front edge 31b of the fin 31. Therefore, the front edge 31b is formed rectilinearly along the vertical direction. Unlike in the example of the heat sink 130, the projection 31c and the partition section 31d may be provided also at the front edge 31b.

Also in the example of the heat sink 130, the partition sections 131d of all the fins 31 are bent in the same direction. In other words, in all the fins 31, the partition sections 131d are bent to the left side. Unlike in the example of the heat sink 130, the heat sink may have partition sections different in bending direction.

As in the heat sink 30, also in the heat sink 130, each fin 31 has, at its upper edge 31e, a connection section 31j bent toward the adjacent fin 31. The connection section 31j and the partition section 131d are bent in the same direction. In the example of the heat sink 130, the partition section 131d and the connection section 31j are bent to the left side. According to such a fin 31, formation of the fin 31 can be simplified. Unlike in the example of the heat sink 130, the partition section 131d and the connection section 31j may be bent in opposite directions.

As described above, the connection section 31j is connected to the upper edge 31e of the adjacent fin 31. On the other hand, the length L2 (see FIG. 11C) of the partition section 131d is smaller than the distance between the adjacent two fins 31, as in the case of the partition section 31d depicted in FIG. 10C and the like. Therefore, when the heat sink 130 is viewed in the front-rear direction, there is a gap between the partition section 131d and the adjacent fin 31. This makes it possible to facilitate decrease of the noise in the electronic apparatus in which the heat sink 130 is mounted.

[Layout of Heat Sink (Foreign Matter Preventing Member)]

Figure 13A:
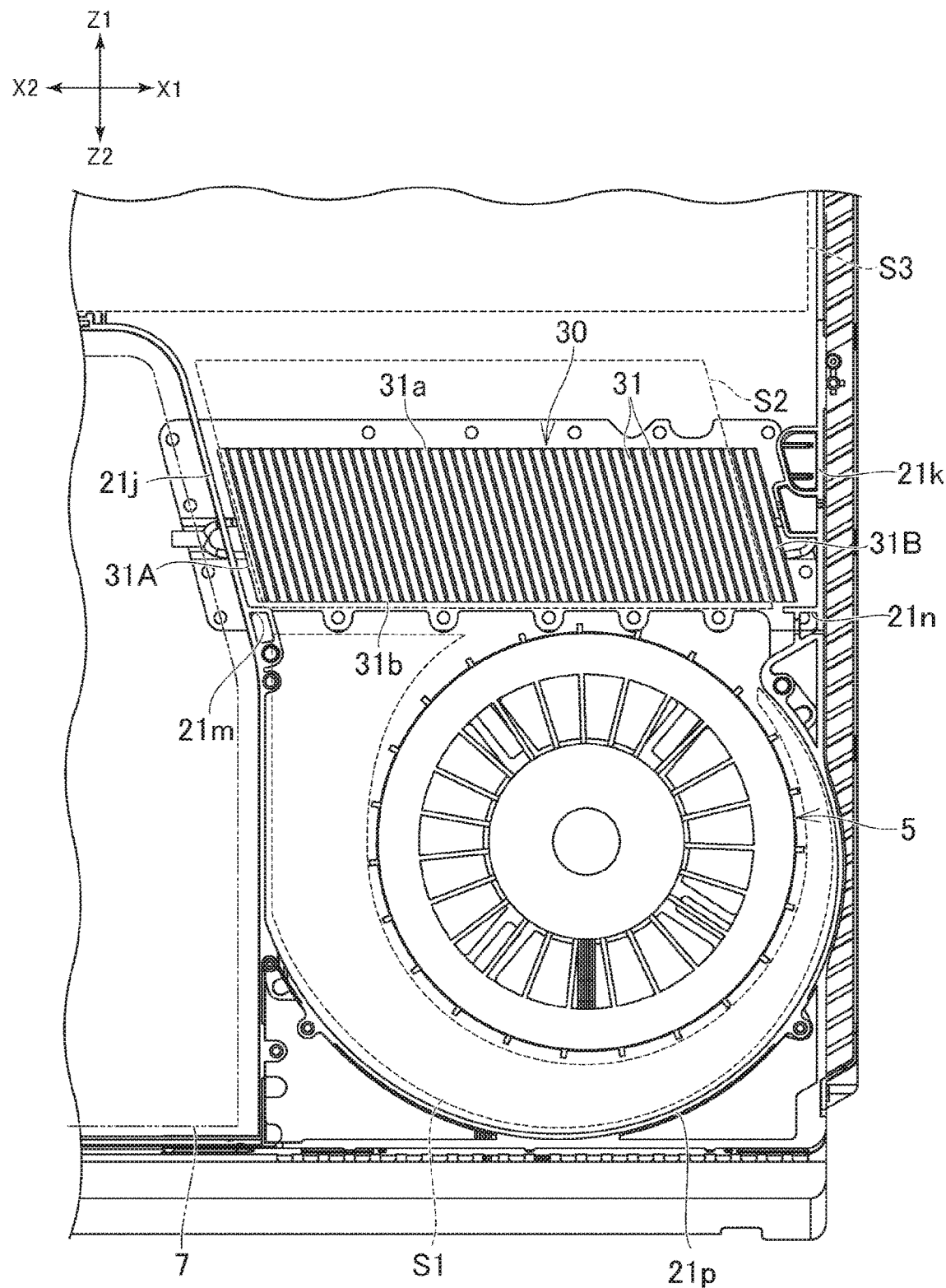
FIG. 13A is a plan view depicting the layout of the heat sink depicted in FIG. 12, in which a cover depicted in FIGS. 3 and 12 is detached.

As depicted in FIG. 3, the apparatus main body 10 has the air flow paths S1, S2, and S3 formed downstream of the cooling fan 5. The air flow paths S1, S2, and S3 are partitioned from other regions of the apparatus main body 2 by the cover, case, and wall member. The first air flow path S1 is formed in the periphery of the cooling fan 5. In detail, the first air flow path S1 is defined between the outer periphery of the cooling fan 5 and a curved wall 21p (see FIG. 13A) surrounding the cooling fan 5. The second air flow path S2 extends rearward from the first air flow path S1 and is located on the rear side of the cooling fan 5. The abovementioned heat sink 30 or heat sink 130 is disposed in the second air flow path S2. In FIG. 13A, the heat sink 30 is disposed in the second air flow path S2, as an example. The heat sink 130 may be disposed in the second air flow path S2.

As illustrated in FIG. 13A, the second air flow path S2 is defined by a left wall section 21j and a right wall section 21k which are located on opposite sides of the heat sink 30 in the left-right direction. The left wall section 21j and the right wall section 21k are formed integrally with the armor frame 21, for example. The upper side of the heat sink 10 is covered with the cover 8 (see FIG. 12). The integrated circuit 4a mounted on the circuit board 4 is located on the lower side of the heat sink 30. A lower surface of the base 12 of the heat sink 30 is pressed against the integrated circuit 4a.

As described above, the rear edge 31a of the fin 31 is formed with the partition sections 31d. On the other hand, the front edge 31b is not formed with the partition sections 31d, and the front edge 31b is formed rectilinearly. As depicted in FIG. 13A, the heat sink 30 has fins 31A and 31B located at end portions of the plural fins 31. The fins 31A and 31B will be referred to as the "end fins" in the following.

Figure 13B:
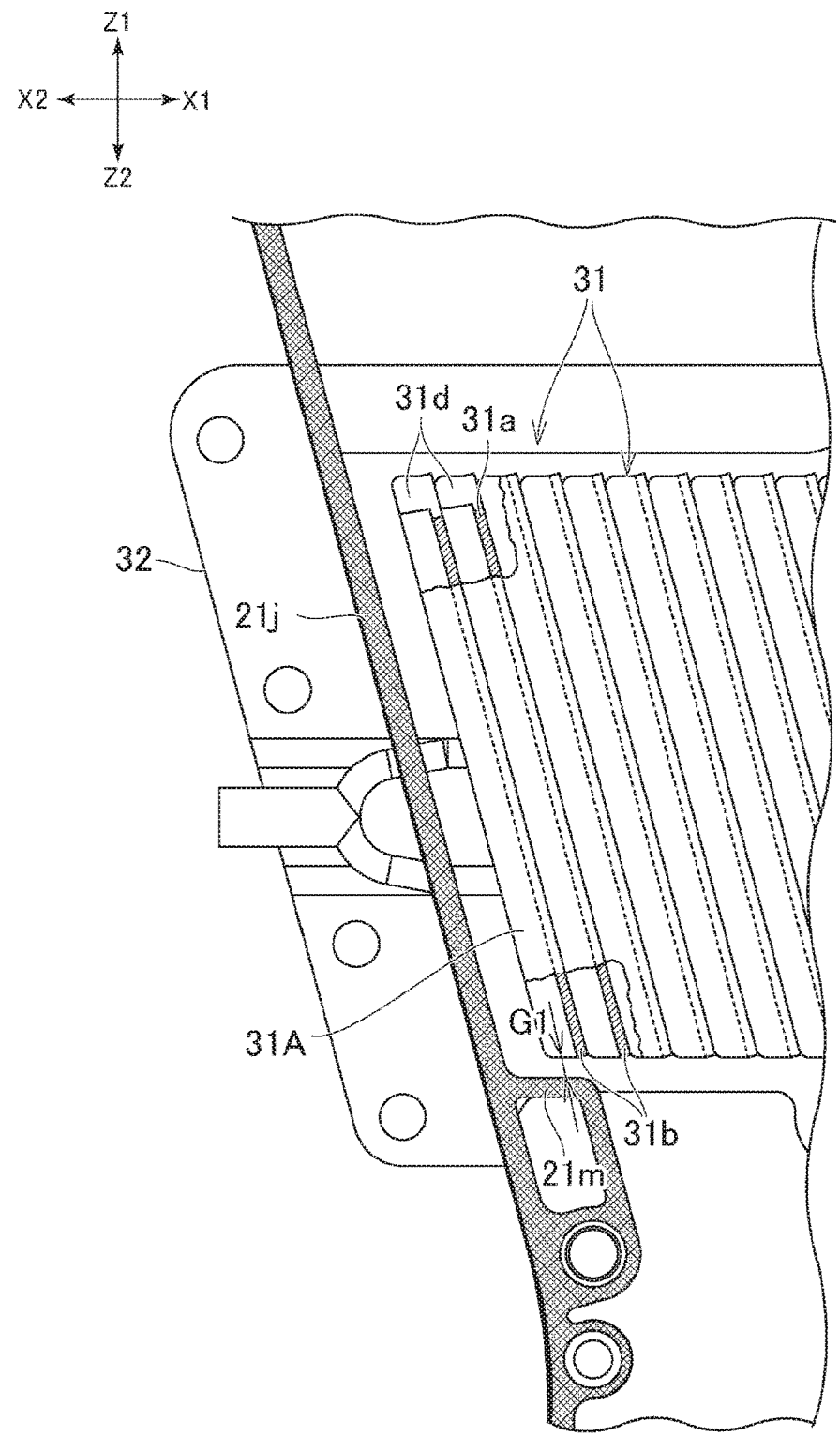
FIG. 13B is an enlarged view of FIG. 13A.

The heat sink 30 is disposed such that its front edge 31b faces to the front side of the electronic apparatus 100. The heat sink 30 is disposed such that its front edge 31b is located upstream in regard of the air flow path and its rear edge 31a is located downstream in regard of the air flow path. As depicted in FIG. 13B, the left wall section 21j defining the second air flow path S2 includes a projecting wall section 21m which is located on the front side of the front edge 31b of the end fin 31A on the left side and which stands along the front edge 31b. The projecting wall section 21m projects from the left wall section 21j toward the inside of the air flow path. Since the partition sections 31d are not formed at the front edge 31b of the fin 31, a gap G1 between the front edge 31b and the projecting wall section 21m can be reduced. As a result, generation of an airflow passing further on the left side of the end fin 31A on the left side can be restrained.

Note that the width in the left-right direction of the projecting wall section 21m corresponds to the position of the end fin 31A on the left side. Therefore, the projecting wall section 21m is not located on the front side of the fin 31 (the second fin 31 from the left end) adjacent to the end fin 31A.

As illustrated in FIG. 13A, the right wall section 21k defining the second air flow path S2 includes a projecting wall section 21n which is located on the front side of the front edge 31b of the end fin 31B on the right side and which stands along the front edge 31b. This ensures that since the partition sections 31d are not formed at the front edge 31b, the distance between the front edge 31b and the projecting wall section 21n can be reduced. As a result, generation of an airflow passing further on the right side of the end fin 31B on the right side can be restrained. Note that the width in the left-right direction of the projecting wall section 21n also corresponds to the position of the end fin 31B on the right side, and the projecting wall section 21n is not located on the front side of the fin 31 (the second fin 31 from the left end) adjacent to the end fin 31B.

Note that the heat sink proposed in the present disclosure is not limited to the examples of the heat sinks 30 and 130. In addition, the electronic apparatus proposed in the present disclosure is not limited to the example of the electronic apparatus 100.

For example, the partition sections 31d and 131d may be provided at both the front edge 31b and the rear edge 31a of each fin 31.

The fins 31 may not necessarily be formed by stamping and bending. For example, the heat sink 30 may be formed by casting and cutting. In this case, the base 32 and the fin 31 may be formed integrally.

In addition, the partition sections 31d and 131d may not necessarily be parts formed integrally with the fin 31. For example, a grid-shaped member may be attached to an edge of the fin 31, to function as the partition sections 31d and 131d. Besides, an elongate rod-shaped member may be attached to an edge of the fin 31, to function as the partition sections 31d and 131d.

The heat sinks 30 and 130 may not necessarily have the connection section 31j at the upper edge 31e of the fin 31.

Besides, the bending method for the partition sections 31d and 131d is not limited to that in the examples of the heat sinks 30 and 130. For example, a thin (diametrically small) projection projecting from the rear edge 31a may be formed. Tip (rear end) of this projection may be bent toward the adjacent fin, and the bent portion may function as the partition section.

Note that the heat sinks 30 and 130 may be disposed such that their front edge 31b is located downstream in regard of the air flow path and their rear edge 31a is located upstream in regard of the air flow path.

The invention claimed is:

1. An electronic apparatus comprising:
   an armor member;
   plural vent holes formed in the armor member;
   an air flow path formed inside the armor member and connected to the plural vent holes;
   a heat generating part disposed in the air flow path; and
   a first foreign matter preventing member located between the heat generating part and the plural vent holes, wherein:
   the first foreign matter preventing member is formed with plural openings,
   a size of each of the plural openings is smaller than a size of each of the plural vent holes the armor member has a first partition section for partitioning the plural vent holes, the first foreign matter preventing member has a second partition section for partitioning the plural openings, and when the first foreign matter preventing member is viewed in a flow direction of air passing through the plural openings, a thickness of the second partition section is smaller than a thickness of the first partition section.

2. The electronic apparatus according to claim 1, wherein the first foreign matter preventing member is disposed along the plural vent holes.

3. The electronic apparatus according to claim 1, wherein the first foreign matter preventing member is a member formed separately from the armor member.

4. The electronic apparatus according to claim 1, wherein the first foreign matter preventing member is attached to the armor member.

5. The electronic apparatus according to claim 1, wherein the first foreign matter preventing member is attached to a part between the plural vent holes.

6. The electronic apparatus according to claim 1, wherein the first foreign matter preventing member is formed from a resin.

7. The electronic apparatus according to claim 1, wherein the armor member includes:

a first wall section formed along a first direction; and a second wall section spaced from the first wall section in a second direction which is a direction intersecting the first wall section and is deviated from the first wall section in a third direction which intersects the first direction and the second direction, the plural vent holes are formed between the first wall section and the second wall section and are aligned in the first direction, and the first foreign matter preventing member is disposed along the first wall section.

8. The electronic apparatus according to claim 1, wherein the first foreign matter preventing member is disposed in one of an upstream and a downstream of the heat generating part in regard of the air flow path, and a second foreign matter preventing member is disposed in the other of the upstream and the downstream of the heat generating part in regard of the air flow path.

9. The electronic apparatus according to claim 8, wherein the foreign matter preventing members are heat sinks.

10. The electronic apparatus according to claim 8, wherein the second foreign matter preventing member has plural wall sections aligned in a first direction and partitioning the air flow path and allows an airflow in a second direction intersecting the first direction as an airflow between the plural wall sections, each of the plural wall sections has a first edge and a second edge that are located on opposite sides in regard of the second direction, the first edge of each of the plural wall sections is provided with at least one partition, and when the plural wall sections are viewed in the second direction, the at least one partition is located between adjacent two wall sections and partitions the air flow path between the adjacent two wall sections into air flow paths smaller than the air flow path between the adjacent two wall sections.

11. An electronic apparatus comprising:

an armor member;

plural vent holes formed in the armor member;

an air flow path formed inside the armor member and connected to the plural vent holes;

a heat generating part disposed in the air flow path; and a first foreign matter preventing member located between the heat generating part and the plural vent holes, wherein:

the first foreign matter preventing member is formed with plural openings, a size of each of the plural openings is smaller than a size of each of the plural vent holes, and the armor member includes:

a first wall section formed along a first direction; and a second wall section spaced from the first wall section in a second direction which is a direction intersecting the first wall section and is deviated from the first wall section in a third direction which intersects the first direction and the second direction, the plural vent holes are formed between the first wall section and the second wall section and are aligned in the first direction, and the first foreign matter preventing member is disposed along the first wall section.

12. The electronic apparatus according to claim 11, wherein at least one of:

the first foreign matter preventing member is disposed along the plural vent holes, and the first foreign matter preventing member is a member formed separately from the armor member.

13. The electronic apparatus according to claim 11, wherein the armor member has a first partition section for partitioning the plural vent holes, the first foreign matter preventing member has a second partition section for partitioning the plural openings, and when the first foreign matter preventing member is viewed in a flow direction of air passing through the plural openings, a thickness of the second partition section is smaller than a thickness of the first partition section.

14. The electronic apparatus according to claim 11, wherein at least one of:

the first foreign matter preventing member is attached to the armor member, the first foreign matter preventing member is attached to a part between the plural vent holes, and the first foreign matter preventing member is formed from a resin.

15. The electronic apparatus according to claim 11, wherein at least one of:

the first foreign matter preventing member is disposed in one of an upstream and a downstream of the heat generating part in regard of the air flow path, a second foreign matter preventing member is disposed in the other of the upstream and the downstream of the heat generating part in regard of the air flow path, the foreign matter preventing members are heat sinks, the second foreign matter preventing member has plural wall sections aligned in the first direction and partitioning the air flow path and allows an airflow in the second direction intersecting the first direction as an airflow between the plural wall sections, each of the plural wall sections has a first edge and a second edge that are located on opposite sides in regard of the second direction, the first edge of each of the plural wall sections is provided with at least one partition, and when the plural wall sections are viewed in the second direction, the at least one partition is located between adjacent two wall sections and partitions the air flow path between the adjacent two wall sections into air flow paths smaller than the air flow path between the adjacent two wall sections.

16. An electronic apparatus comprising:

an armor member;

plural vent holes formed in the armor member;

an air flow path formed inside the armor member and connected to the plural vent holes;

a heat generating part disposed in the air flow path; and a first foreign matter preventing member located between the heat generating part and the plural vent holes, wherein:

the first foreign matter preventing member is formed with plural openings, a size of each of the plural openings is smaller than a size of each of the plural vent holes, the first foreign matter preventing member is disposed in one of an upstream and a downstream of the heat generating part in regard of the air flow path, a second foreign matter preventing member is disposed in the other of the upstream and the downstream of the heat generating part in regard of the air flow path, the second foreign matter preventing member has plural wall sections aligned in a first direction and partitioning the air flow path and allows an airflow in a second direction intersecting the first direction as an airflow between the plural wall sections, each of the plural wall sections has a first edge and a second edge that are located on opposite sides in regard of the second direction, the first edge of each of the plural wall sections is provided with at least one partition, and when the plural wall sections are viewed in the second direction, the at least one partition is located between adjacent two wall sections and partitions the air flow path between the adjacent two wall sections into air flow paths smaller than the air flow path between the adjacent two wall sections.

* * * * *